United States Patent
Motoyama et al.

(10) Patent No.: US 12,062,609 B2
(45) Date of Patent: Aug. 13, 2024

(54) ELECTRONIC FUSE STRUCTURE EMBEDDED IN TOP VIA

(71) Applicant: International Business Machines Corporation, Armonk, NY (US)

(72) Inventors: Koichi Motoyama, Clifton Park, NY (US); Chanro Park, Clifton Park, NY (US); Hsueh-Chung Chen, Cohoes, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 245 days.

(21) Appl. No.: 17/453,670

(22) Filed: Nov. 5, 2021

(65) Prior Publication Data
US 2023/0144660 A1    May 11, 2023

(51) Int. Cl.
*H01L 23/525* (2006.01)
*H01L 21/768* (2006.01)
*H01L 23/522* (2006.01)

(52) U.S. Cl.
CPC .... *H01L 23/5256* (2013.01); *H01L 21/76816* (2013.01); *H01L 21/7684* (2013.01); *H01L 21/76877* (2013.01); *H01L 23/5226* (2013.01)

(58) Field of Classification Search
CPC ............. H01L 23/5256; H01L 23/5226; H01L 23/5258; H01L 21/76816; H01L 21/7984; H01L 21/76877; H01L 21/76834; H01L 21/76831; H01L 21/76885; H01L 21/76897
See application file for complete search history.

(56) References Cited

U.S. PATENT DOCUMENTS

| | | | |
|---|---|---|---|
| 4,536,951 A | 8/1985 | Rhodes et al. | |
| 5,693,568 A | 12/1997 | Liu et al. | |
| 7,545,667 B2 | 6/2009 | Elmegreen et al. | |
| 7,770,067 B2 | 8/2010 | Lockwood et al. | |
| 9,024,411 B2 | 5/2015 | Li et al. | |
| 9,093,453 B2 | 7/2015 | Li et al. | |
| 9,613,861 B2 | 4/2017 | Anderson et al. | |
| 9,685,404 B2 | 6/2017 | Bao et al. | |
| 10,811,353 B2 | 10/2020 | Li et al. | |
| 10,847,458 B1 | 11/2020 | Yang et al. | |
| 2002/0155693 A1 | 10/2002 | Hong et al. | |
| 2008/0206978 A1* | 8/2008 | Hsu ................... | H01L 21/76892 257/E23.149 |

(Continued)

OTHER PUBLICATIONS

Kothandaraman et al., "Electrically Programmable Fuse (eFUSE) using Electromigration in Silicides," IEEE Electron Device Letters, vol. 23, No. 9, 2002, pp. 523-525.

*Primary Examiner* — Shahed Ahmed
*Assistant Examiner* — Vicki B. Booker
(74) *Attorney, Agent, or Firm* — Robert J. Shatto

(57) ABSTRACT

Provided is a semiconductor device and corresponding method of fabricating the same. The semiconductor device comprises a plurality of bottom lines. One or more top vias are arranged on top of the plurality of bottom lines. One or more electronic fuses (eFuses) are also arranged on top of the plurality of bottom lines. Each eFuse of the one or more eFuses is a via having a smaller critical dimension that the one or more top vias. A plurality of top lines are arranged on top of the one or more top vias and the one or more eFuses.

15 Claims, 21 Drawing Sheets

(56) References Cited

U.S. PATENT DOCUMENTS

| | | | |
|---|---|---|---|
| 2008/0296728 A1* | 12/2008 | Yang | H01L 23/5252 |
| | | | 257/E21.585 |
| 2014/0239439 A1* | 8/2014 | Hogle | H01L 23/53238 |
| | | | 257/529 |
| 2015/0056800 A1 | 2/2015 | Mebarki et al. | |
| 2020/0111741 A1* | 4/2020 | Yang | H01L 23/5256 |
| 2020/0176379 A1 | 6/2020 | Manfrini et al. | |

* cited by examiner

ELECTRONIC FUSE STRUCTURE EMBEDDED IN TOP VIA

BACKGROUND

The present invention relates in general to semiconductor fabrication methods and resulting structures. More specifically, the present invention relates to forming eFuse structures in top via interconnects.

An electronic fuse (eFuse) is a microscopic fuse embedded into an integrated circuit. eFuses are often used to as a one-time programmable read-only memory (ROM) or to dynamically reprogram an integrated circuit in real-time. For example, if a sub-system in an integrated circuit has failed, the integrated circuit's behavior can be instantly changed by blowing one or more eFuses, thereby changing the integrated circuit's structure. As another example, some gaming consoles have utilized eFuses to permanently record a newer version of a ROM to prevent downgrading of the firmware.

SUMMARY

Embodiments of the present invention include fabrication methods and the corresponding structures. In some embodiments, the fabrication method comprises forming one or more dummy vias on top of one or more bottom lines on a substrate. The method further comprises selectively etching a first dummy via of the one or more dummy vias to reduce a size of the first dummy via. The method further comprises depositing a dielectric layer around the one or more dummy vias. The method further comprises removing the first dummy via to create a first eFuse vacancy. The method further comprises depositing a conductive material in the first eFuse vacancy to create an eFuse. The method further comprises forming one or more top lines. One of the top lines is formed on top of the eFuse.

Additional embodiments of the present disclosure include a second fabrication method. The fabrication method comprises forming one or more dummy vias on top of one or more bottom lines on a substrate. The method further comprises encapsulating the one or more dummy vias in a dielectric material. The method further comprises performing a planarization process to remove a portion of the dielectric material and expose a top surface of the one or more dummy vias. The method further comprises removing a first dummy via to create a first eFuse vacancy. The method further comprises depositing a spacer material in the first eFuse vacancy. The spacer material is deposited along sidewalls of the first eFuse vacancy but does not fill the first eFuse vacancy. The method further comprises depositing a conductive material in the first eFuse vacancy to create an eFuse. The method further comprises removing the spacer material. The method further comprises forming one or more top lines. One top line of the one or more top lines is formed on top of the eFuse.

Further embodiments of the present disclosure include a semiconductor device. The semiconductor device comprises a plurality of bottom lines. One or more top vias are arranged on top of the plurality of bottom lines. One or more electronic fuses (eFuses) are also arranged on top of the plurality of bottom lines. Each eFuse of the one or more eFuses is a via having a smaller critical dimension that the one or more top vias. A plurality of top lines are arranged on top of the one or more top vias and the one or more eFuses.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
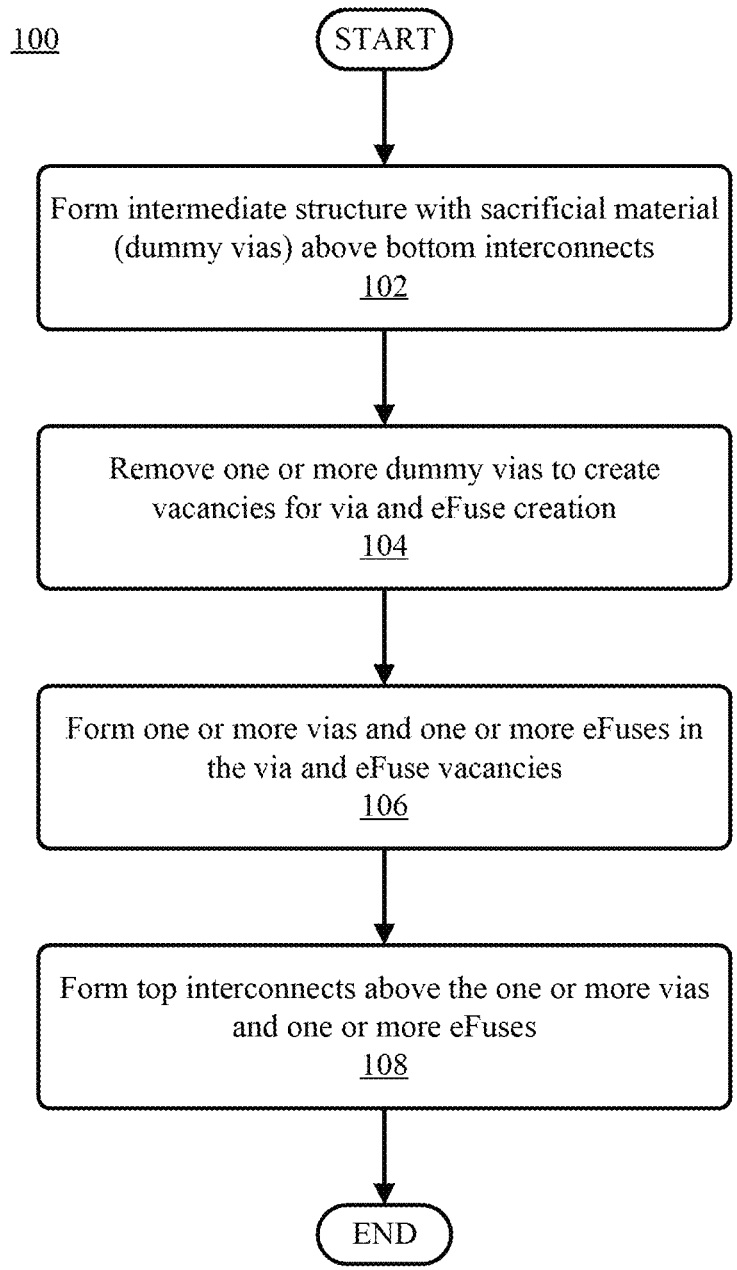
FIG. 1 illustrates a flowchart of an example method for forming an eFuse in a top via, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Embodiments of the present invention are generally directed to semiconductor fabrication methods and resulting structures, and more particularly to eFuse structures and methods of making eFuse structures in top vias. While the present disclosure is not necessarily limited to such applications, various aspects of the disclosure may be appreciated through a discussion of various examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist.

To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, fuse devices are useful in complementary metal-oxide-semiconductor (CMOS) chips for redundancy implementation in memory arrays, for trimming resistors, capacitors and other discrete components in analog circuits, for permanently holding information. A typical implementation is a laser fuse, where laser energy is used to evaporate metal links, and the resulting resistance change is sensed using a latch. This device pitch is not scalable below the wavelength of the laser beam, typically 1.06 um, resulting in excessive use of chip area. This approach limits the choice of inter-level dielectrics and metal interconnects. Another implementation is a silicide fuse, where an electrical current is used to burn out the silicide line. However, silicide is not easy to burn out thoroughly, and re-growth is an issue.

Embodiments of the present disclosure may overcome the above issues with current eFuse technologies. Some embodiments of the present disclosure include an eFuse structure embedded in small-dimension top via interconnects. In particular, the eFuse is fabricated at a via portion between a line above (referred to herein as the top line) and a line below (referred to herein as the bottom line) the via portion, and the eFuse therefor does not take up considerable space (small dimension compatible). The eFuse may be, for example, a smaller via than the vias that are not meant to act as eFuses. In some embodiments, the eFuse may have a different shape than the normal vias.

As recognized by the inventors, an eFuse is the good candidate to overcome scalability challenge especially in advanced nodes. Also, top via structures are being developed to reduce the via resistance for advanced nodes. Thus, it is very important and valuable to come up with the processes which enable to have both eFuse and top via structures together at local level (minimum pitch) for advanced node devices.

Furthermore, because via density is considerably lower than the density at other layers in a semiconductor device, there is considerable room to embed eFuses into the via portion of the semiconductor device. Additionally, the embedded eFuse can be integrated into top via interconnects without significant increases in the number of fabrication process steps required to fabricate the resulting semiconductor device.

The via resistance of the eFuses can be kept low due to the eFuse having a top via structure. The properties of the eFuse are also easily modified by changing the materials and critical dimensions (e.g., thickness, cross-sectional area, etc.) of the eFuse. For example, thinner eFuses will have a higher electrical resistance. The critical dimension, and therefore properties, of the eFuse via is easily controlled by modulating wet process time and concentration of wet chemical. In some embodiments, the eFuse will have a critical dimension of approximately 5 nm-20 nm.

Because the eFuse properties can be controlled by modifying the critical dimension of the eFuse, any suitable conductive material can be used. In some embodiments, the eFuses may be made using, for example, W, Cu, Al, Ta, Co, Ru, or Rh. Cu may be especially good for the eFuse portion of the via because of lower melting point of Cu.

Additional embodiments of the present disclosure include methods of forming the top via eFuses. Broadly speaking, the method comprises patterning lines on a substrate using, for example, RIE processes. Additionally, the lines may include a dielectric layer patterned above them. The dielectric layer may be patterned so as to create dummy vias above the bottom interconnects (lines). One or more of the dummy vias may be removed to create vacancies for the vias and eFuses. One or more eFuses and one or more vias may be formed in the vacancies (e.g., trenches). Top interconnects may then be formed above the one or more vias and the one or more eFuses.

In some embodiments, removing the one or more dummy vias comprises exposing at least one dummy via that is to be made into an eFuse and performing an etch process to reduce the size of the exposed dummy via. A spin-on-glass (SOG) fill process and SOG CMP process may then be performed to form a dielectric layer around the dummy vias. The dummy vias that are in a location corresponding to an actual via or an eFuse may then be selectively patterned to form vacancies in the dielectric layer. The vacancies may then be filled with a conductive material, such as Cu, to create the one or more vias and the one or more eFuses. Illustrative embodiments of the present disclosure that implement this process are shown in FIGS. 3A-3M.

In some other embodiments, the size of the dummy vias that are to become eFuses are not etched to reduce their size. Instead, an SOG fill process and SOG CMP process are performed to form a dielectric layer around the dummy vias. The dummy vias that are in a location corresponding to an actual via or an eFuse may then be selectively patterned to form vacancies in the dielectric layer. At this stage, the vacancies for the eFuses and the vacancies for the vias may be substantially the same size.

An optical planarization layer (OPL) is deposited on top of the structure such that the OPL fills in the vacancies. A hardmask is then patterned on top of the OPL above the locations of the now-filled vacancies that will include the vias. An OPL etch process is then performed to remove the OPL from the eFuse vacancies. A spacer (e.g., SiN, SiO2) is then deposited on the structure such that the spacer partially, but not fully, fills the eFuse vacancies. The spacer is then etched back such that it is removed from the substantial horizontal portion (i.e., the bottom) of the eFuse vacancies, leaving spacer material just on the sidewalls of the eFuse vacancies.

Figure 4A:
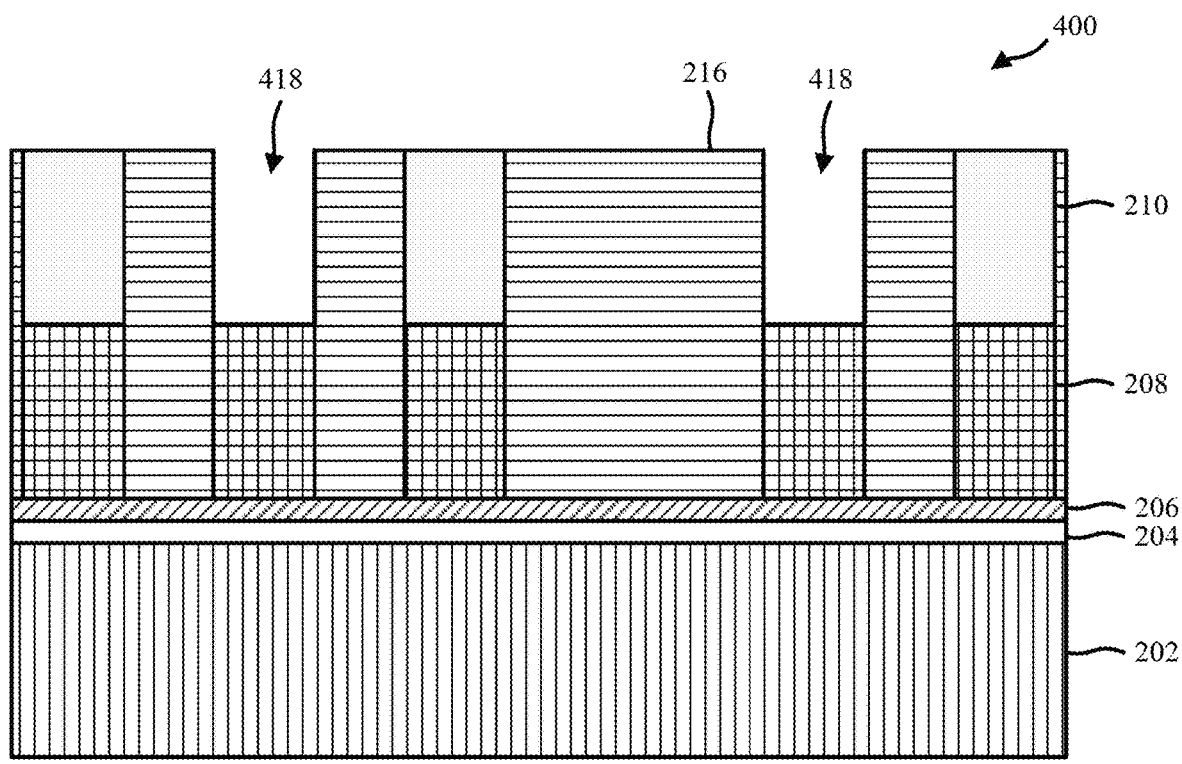
FIG. 4A is a schematic diagram illustrating the example semiconductor structure of FIG. 2C following the performance of additional fabrication operations, in accordance with embodiments of the present disclosure.

A second OPL etchback (or ash) process is then performed to expose the via vacancies. A metal fill is then deposited (with a liner) to fill both the eFuse and via vacancies. The metal fill may be, for example, Cu, Al, Ru, W, etc. The liner may be, for example, TiN. A CMP process is then performed to planarize the structure. The SOG, SiN, and spacer materials are then removed, leaving behind one or more via structures and one or more eFuse structures. As a result of the deposition of the spacer material into the eFuse vacancies, but not the via vacancies, prior to deposition of the metal fill, the eFuse vias are substantially smaller than the regular top vias. This allows the eFuse vias to act as fuses and be tripped through application of a current to melt the metal fill. Illustrative embodiments of the present disclosure that implement this process are shown in FIGS. 4A-4O.

Figure 2A:
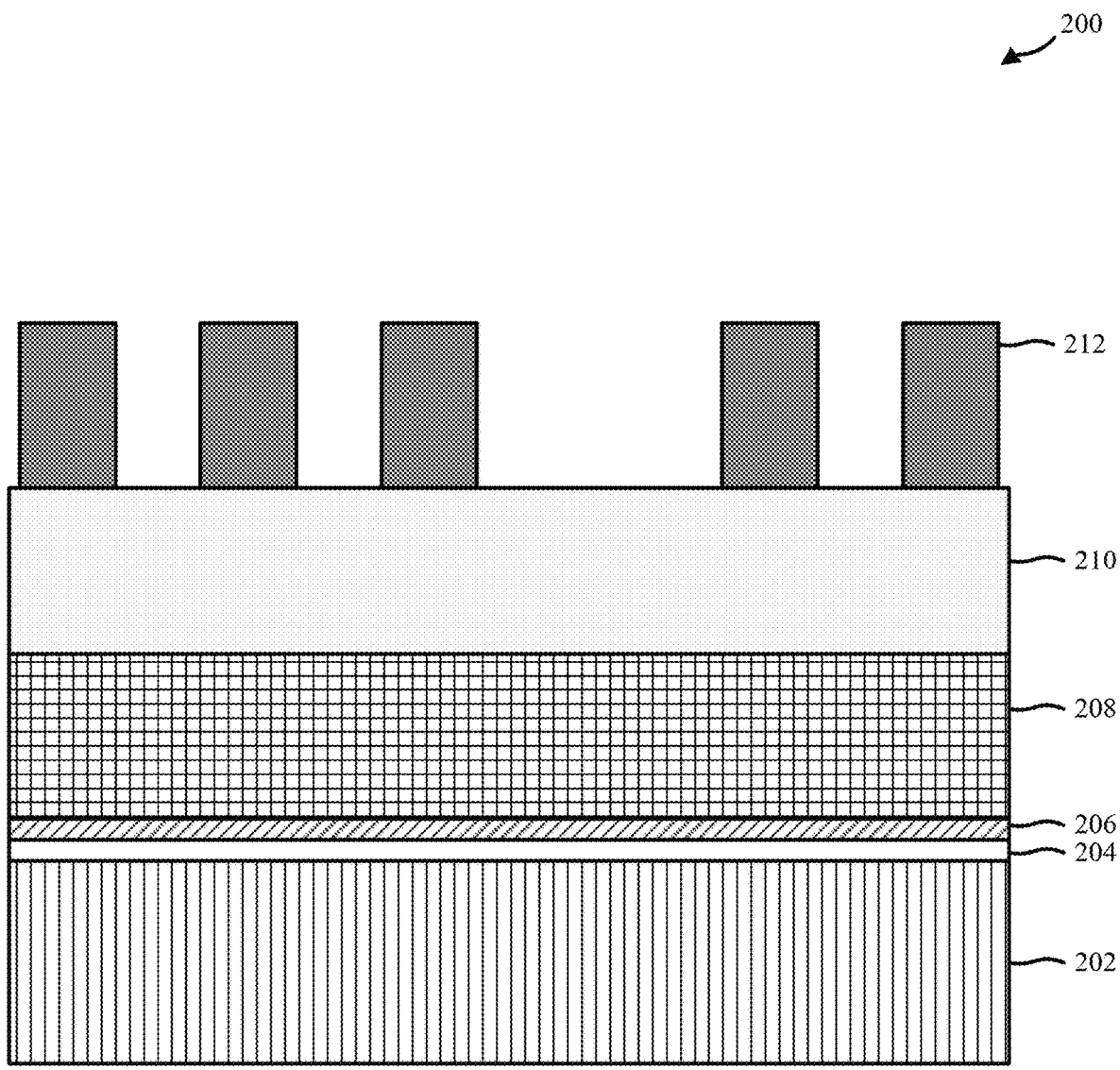
FIG. 2A is a schematic diagram illustrating an example semiconductor component following the performance of a portion of the example method of FIG. 1, in accordance with embodiments of the present disclosure.
Figure 2B:
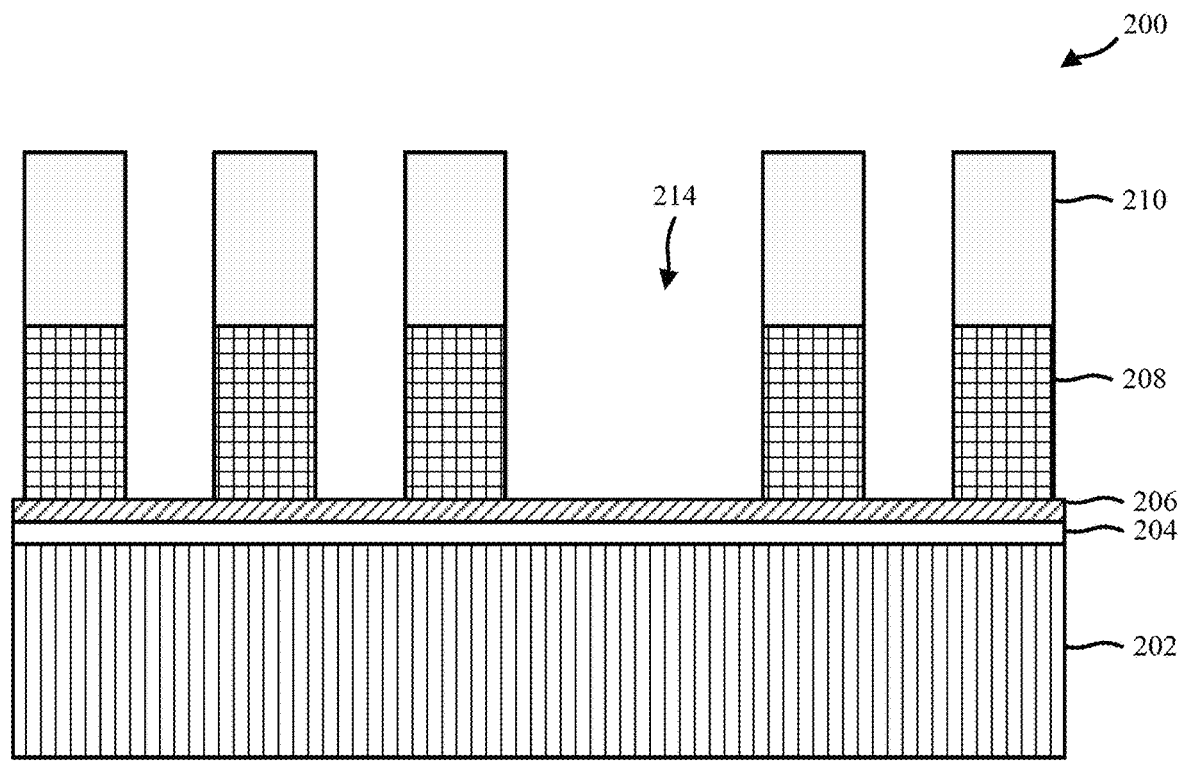
FIG. 2B is a schematic diagram illustrating the example semiconductor structure of FIG. 2A following the performance of additional fabrication operations, in accordance with embodiments of the present disclosure.
Figure 2C:
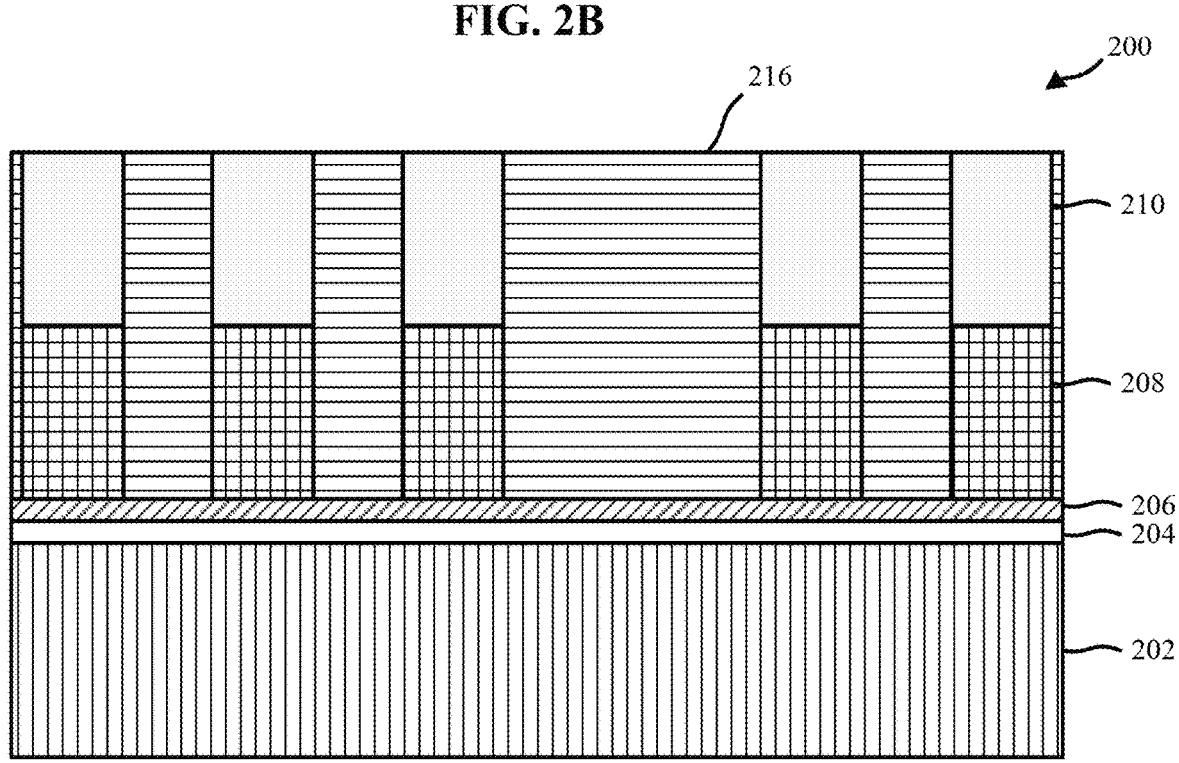
FIG. 2C is a schematic diagram illustrating the example semiconductor structure of FIG. 2B following the performance of additional fabrication operations, in accordance with embodiments of the present disclosure.

Turning now to the figures, FIG. 1 illustrates a flowchart of an example method 100 for forming a semiconductor device having eFuses embedded in top vias, in accordance with embodiments of the present disclosure. FIGS. 2A-2C illustrate the semiconductor device during performance of operation 102. FIGS. 3A-3M illustrate the semiconductor device at various intermediate stages in the fabrication process, in accordance with a first embodiment of the present disclosure. FIGS. 4A-4O illustrate the semiconductor device at various intermediate stages in the fabrication process, in accordance with a second embodiment of the present disclosure.

Referring first to FIG. 1, the method 100 may be performed by, for example, processing logic that comprises hardware (e.g., circuitry, dedicated logic, programmable logic, microcode, etc.), software (e.g., instructions run on a processor), firmware, or any combination thereof. For example, the method 100 may be performed by computer systems of a semiconductor fabrication plant controlling fabrication equipment. The method 100 begins at operation 102, wherein an intermediate structure is formed.

The intermediate structure may comprise bottom interconnects (e.g., lines) with dummy vias arranged on top of the lines. The dummy vias may be made of a sacrificial material that will be replaced in subsequent processing steps. For example, the dummy vias may be made of a dielectric, such as SiN. The bottom lines and dummy vias can be formed using either a damascene flow process or a subtractive flow process in different combinations and orders within the context of two main integration schemes for forming interconnect structures. A damascene flow refers to the processes of forming interconnect structures by depositing an oxide layer, forming a trench into the oxide layer, and then depositing metal into the trench. Alternatively, a subtractive flow refers to processes of forming interconnect structures by depositing metal, and then etching the metal to form the interconnect structures.

In some embodiments, the performance of operation 102 comprises multiple sub-operations. In a first sub-operation, a material stack is formed. An example material stack for a semiconductor device 200 is shown in FIG. 2A. As shown in FIG. 2A, the material stack comprises a substrate 202, which may be any suitable substrate (e.g., a dielectric material). A low-k etch stop layer 204 may be deposited on top of the substrate 202. The etch stop layer 204 may be, for example, a thin layer of silicon carbon nitride (SiCN). A barrier metal 206 may be deposited on top of the low-k etch stop layer 204. The barrier metal 206 may be a diffusion barrier material such as, for example, TaN or TiN.

A layer of conductive metal layer 208 may be deposited on top of the barrier metal 206. The conductive metal layer 208 will subsequently be patterned into bottom lines. As such, any suitable line material may be used, such as, for example, Ru. The conductive metal layer 208 may be deposited using any suitable process. For example, the layer of Ru may be deposited using PVD. A sacrificial layer 210 is then deposited on top of the metal layer 208. The sacrificial layer 210 may be used to create dummy vias and dummy eFuses, which are structures that will be replaced by the actual vias and eFuses. In some embodiments, the sacrificial layer 210 may be, for example, SiN. A hardmask 212 is then deposited on top of the sacrificial layer 210. The hardmask 212 is deposited in locations where the top vias and eFuses will be formed.

In a second sub-operation of operation 102, the sacrificial layer and the metal layers are patterned and etched to create a plurality of lines and a plurality of dummy vias on top of the lines. FIG. 2B shows the semiconductor device 200 after formation of the dummy vias. As shown in FIG. 2B, the sacrificial layer 210 and the metal layer 208 have been selectively etched (using the hardmask 212) to create a plurality of trenches 214 separating a plurality of via stacks. The semiconductor device 200 may be etched using, for example, an RIE process using the barrier layer 206 as an etch stop.

In a third sub-operation of operation 102, a SOG process is performed to fill in the trenches with a dielectric material and support the via stacks. A planarization process may then be performed to planarize the semiconductor device such that the top surface of the dummy vias is substantially coplanar with the dielectric fill. The performance of these suboperations may complete operation 102.

FIG. 2C shows the semiconductor device 200 after performance of the SOG process and CMP process and, therefore, completion of operation 102. As shown in FIG. 2C, a dielectric layer 216 has been deposited on the semiconductor device 200 to fill in the trenches 214 (shown in FIG. 2B). The dielectric layer 216 completely surrounds the via stacks. Additionally, a CMP process has been performed to planarize the top of the semiconductor device and remove any extraneous dielectric 216 that was deposited on top of the via stacks. As a result of the CMP process, the top surface of the dummy vias 210 is substantially coplanar with the top surface of the dielectric 216.

Returning to FIG. 1, one or more dummy vias are removed to create vacancies for via and eFuse creation at operation 104. The vacancies may be formed in locations where vias and eFuses will be created in subsequent processing steps. The performance of operation 104 comprises multiple sub-operations. The specific sub-operations may depend on the specific embodiment being performed. The sub-operations that are performed in accordance with two embodiments of the present disclosure will be discussed below with reference to FIGS. 3A-3M (a first embodiments) and FIGS. 4A-4O (a second embodiment).

At operation 106, one or more vias and one or more eFuses are formed in the via and eFuse vacancies creation at operation 104. The performance of operation 106 comprises multiple sub-operations. The specific sub-operations may depend on the specific embodiment being performed. The sub-operations that are performed in accordance with two embodiments of the present disclosure will be discussed below with reference to FIGS. 3A-3M (a first embodiments) and FIGS. 4A-4O (a second embodiment).

At operation 108, the top interconnects are formed above the one or more vias and the one or more eFuses. The performance of operation 108 comprises multiple sub-operations. The specific sub-operations may depend on the specific embodiment being performed. The sub-operations that are performed in accordance with two embodiments of the present disclosure will be discussed below with reference to FIGS. 3A-3M (a first embodiments) and FIGS. 4A-4O (a second embodiment).

Figure 3A:
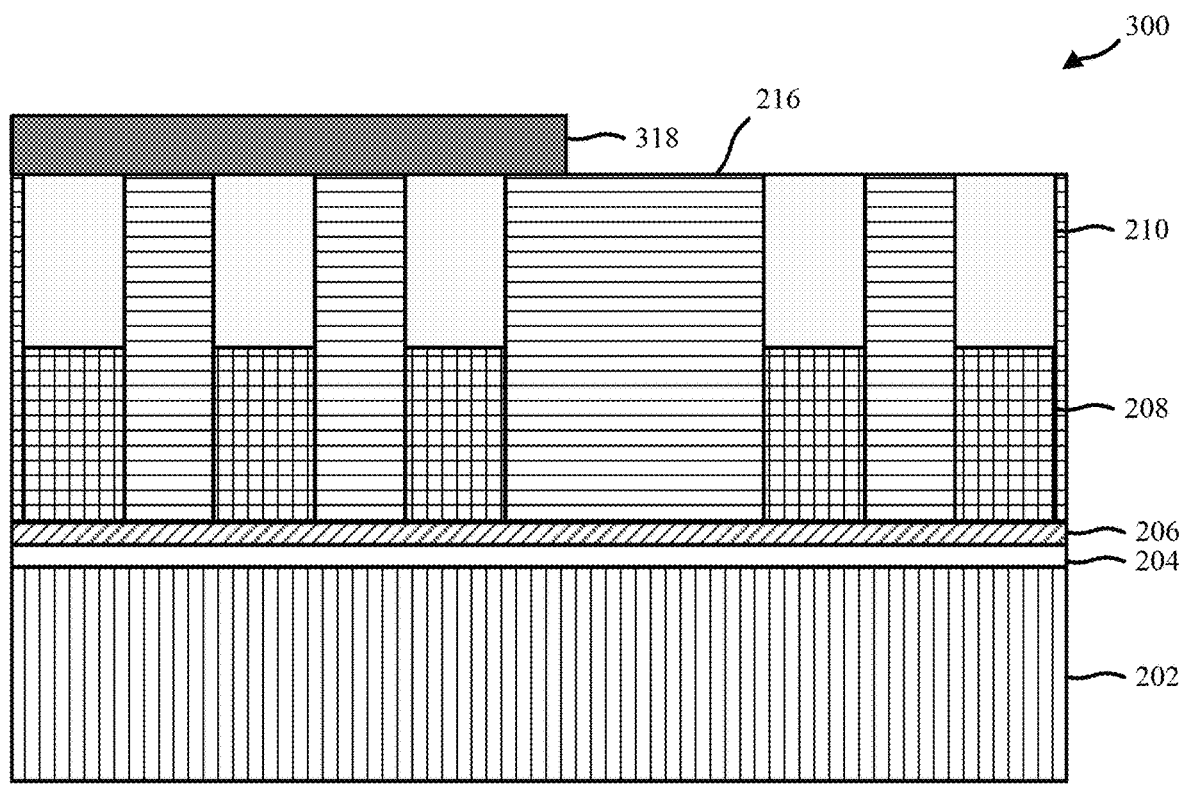
FIG. 3A is a schematic diagram illustrating the example semiconductor structure of FIG. 2C following the performance of additional fabrication operations, in accordance with embodiments of the present disclosure.

Reference will now be made to FIGS. 3A-3M, in which operations 104-108 are performed to form a semiconductor device in accordance with a first embodiment of the present disclosure. Referring first to FIG. 3A, shown is the semiconductor device 300 (e.g., semiconductor device 200 of FIG. 2C) after additional fabrication processing steps have been performed. In particular, FIG. 3A shows the semiconductor device 300 after a second hardmask 318 has been formed and patterned on top of a portion of the semiconductor device 300. In particular, the second hardmask 318 is formed over all of the dummy vias 210 that will be converted into regular vias in subsequent operations.

Figure 3B:
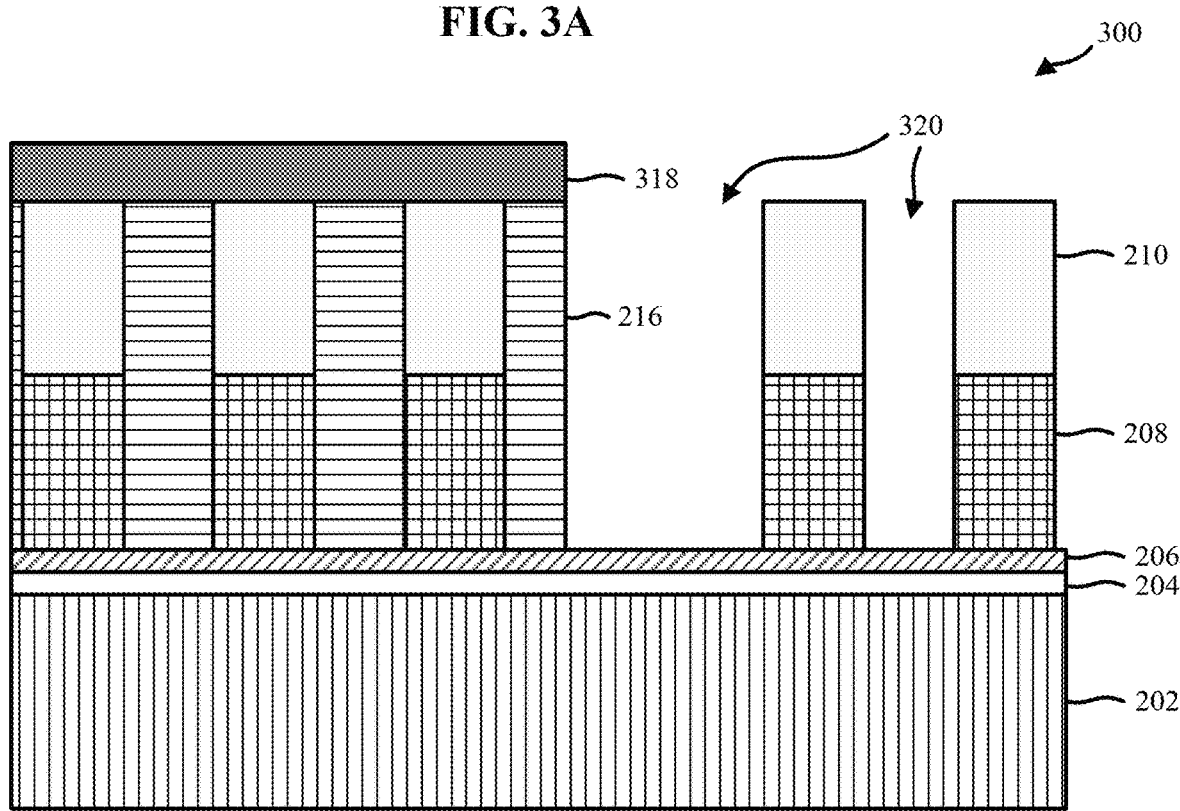
FIG. 3B is a schematic diagram illustrating the example semiconductor structure of FIG. 3A following the performance of additional fabrication operations, in accordance with embodiments of the present disclosure.

After forming the second hardmask 318, the exposed portion of the dielectric layer 216 is removed, as shown in FIG. 3B. The exposed dielectric layer 216 may be removed using, for example, a combination of a UV treatment, such as Advanced Surface Treatment and organic film Removal (ASTR), and dilute hydrofluoric acid etching, with the barrier layer 206 acting as an etch stop. As a result of the etching, large trenches 320 may be formed where the dielectric layer 216 has been removed.

Figure 3C:
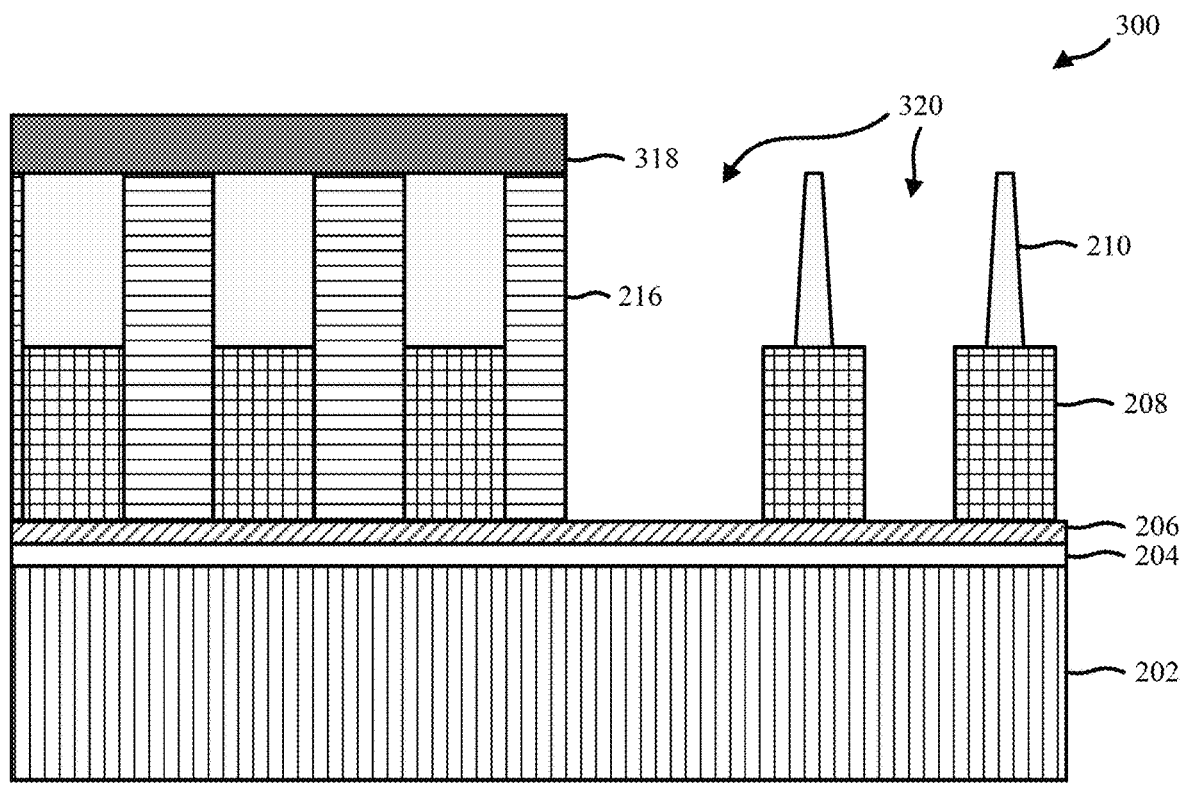
FIG. 3C is a schematic diagram illustrating the example semiconductor structure of FIG. 3B following the performance of additional fabrication operations, in accordance with embodiments of the present disclosure.

An additional wet etching process may then be performed to trim the exposed dummy vias 210, as shown in FIG. 3C. For example, if the dummy vias 210 are made out of SiN, a dHF wet etch may be performed to thin the exposed dummy vias 210. The etching process used, as well as the amount of time that the wet etch is allowed to react with the dummy vias 210, may be controlled in order to control the thickness of the resulting dummy vias 210. As shown in FIG. 3C, the wet etching may also change the shape of the exposed dummy vias 210 such that the thickness of the dummy vias 210 is larger at the bottom (i.e., where the dummy vias 210 touch the metal lines 208) than at the top.

Figure 3D:
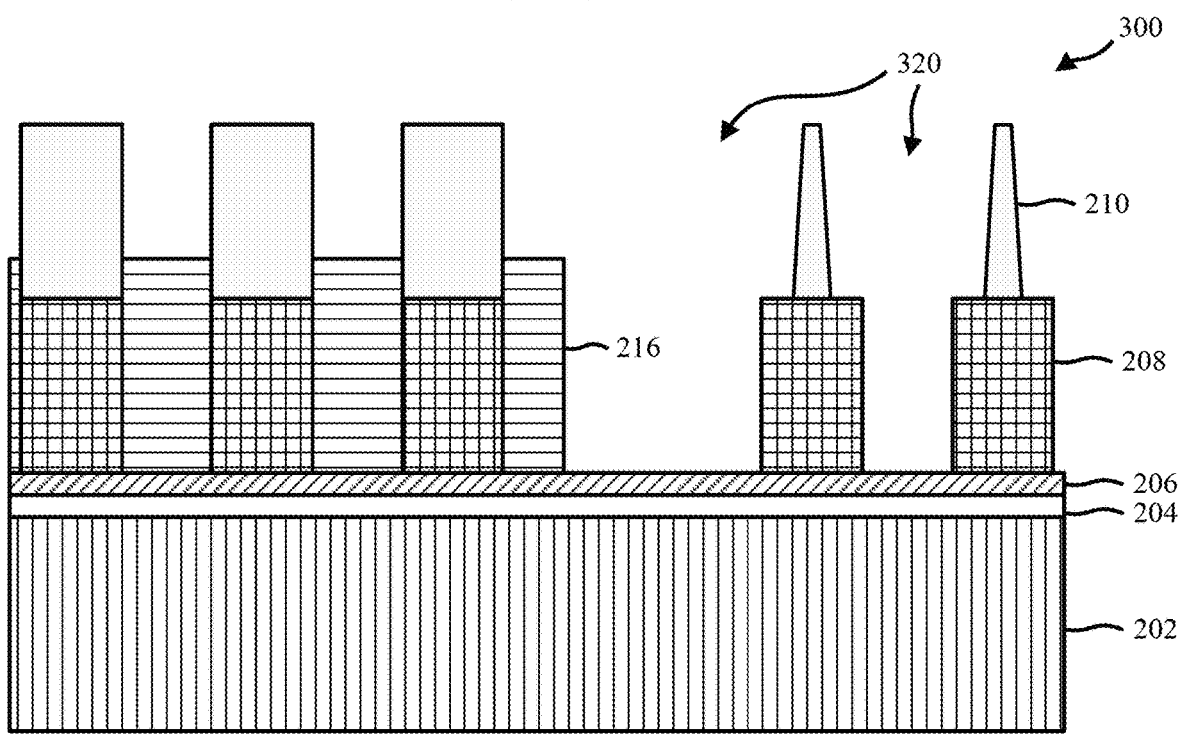
FIG. 3D is a schematic diagram illustrating the example semiconductor structure of FIG. 3C following the performance of additional fabrication operations, in accordance with embodiments of the present disclosure.
Figure 3E:
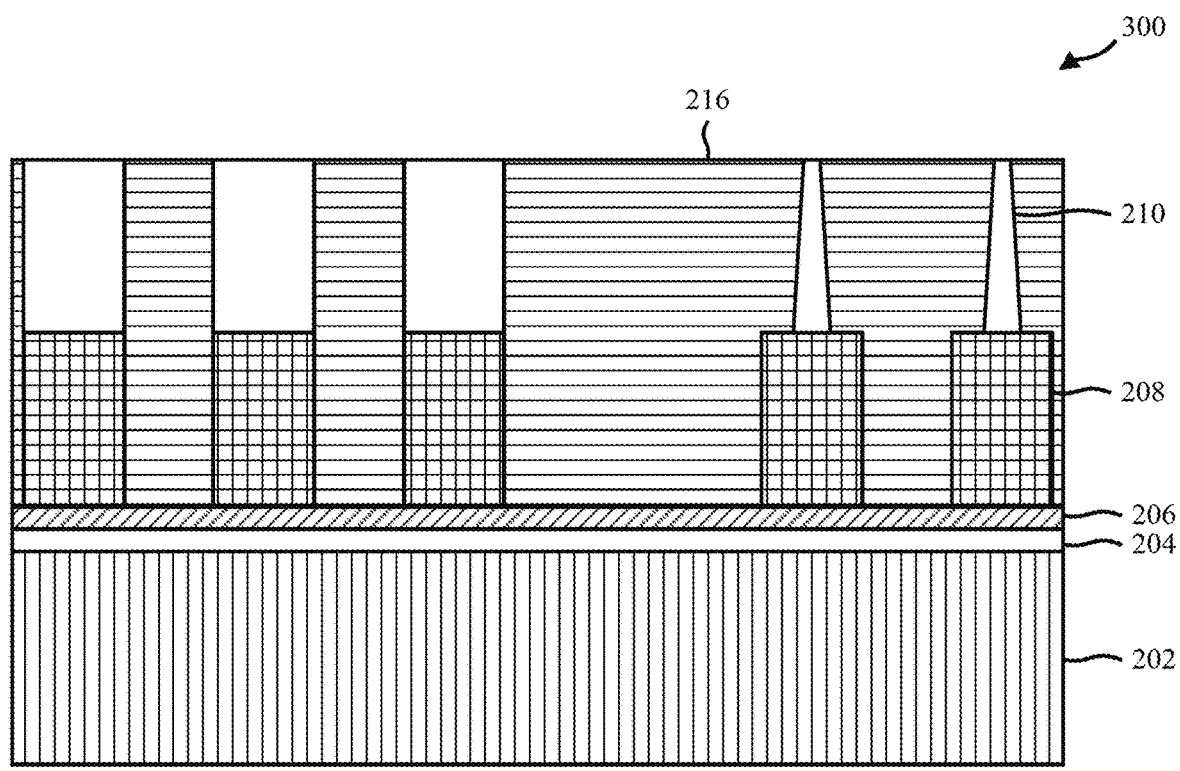
FIG. 3E is a schematic diagram illustrating the example semiconductor structure of FIG. 3D following the performance of additional fabrication operations, in accordance with embodiments of the present disclosure.

As shown in FIG. 3D, a hardmask and dielectric etch process may be used to remove the second hardmask 318. As a result of the removal of the second hardmask 318, the dielectric layer 216 may be reduced as well. However, a subsequent SOG fill and SOG CMP process may then be performed to again fill the gaps 320 in the dielectric layer 216, as shown in FIG. 3E. Additionally, the CMP process may be performed in order to planarize the dielectric layer 216 such that the top surface of the dielectric layer 216 is substantially coplanar with the top surface of the dummy vias 210.

Figure 3F:
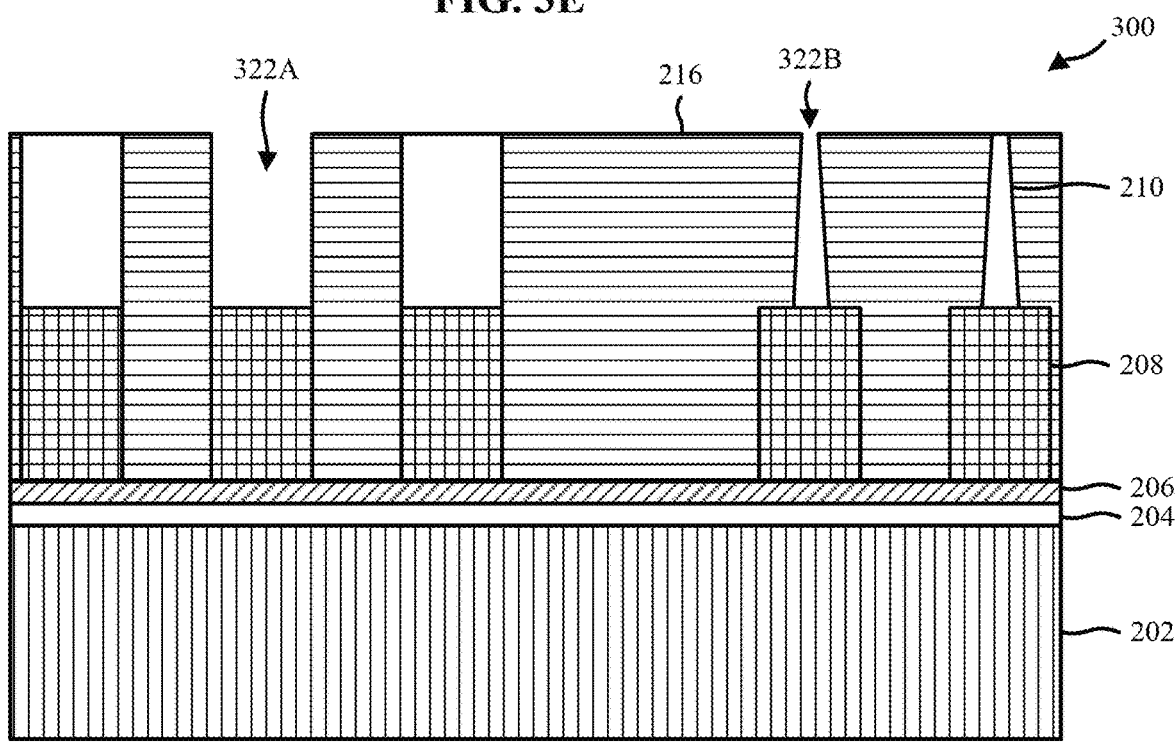
FIG. 3F is a schematic diagram illustrating the example semiconductor structure of FIG. 3E following the performance of additional fabrication operations, in accordance with embodiments of the present disclosure.

Via patterning may then be performed to remove one or more dummy vias 210 (selective to the dielectric layer 216) to create a plurality of vacancies in the dielectric layer 216. This is shown in FIG. 3F. The vacancies may be created in areas where vias and eFuses will be created in subsequent processing operations. In particular, the vacancies may include one or more via vacancies 322A and one or more eFuse vacancies 322B in the dielectric layer 216. The via vacancies 322A and eFuse vacancies 322B are collectively and individually referred to herein as vacancies 322.

Figure 3G:
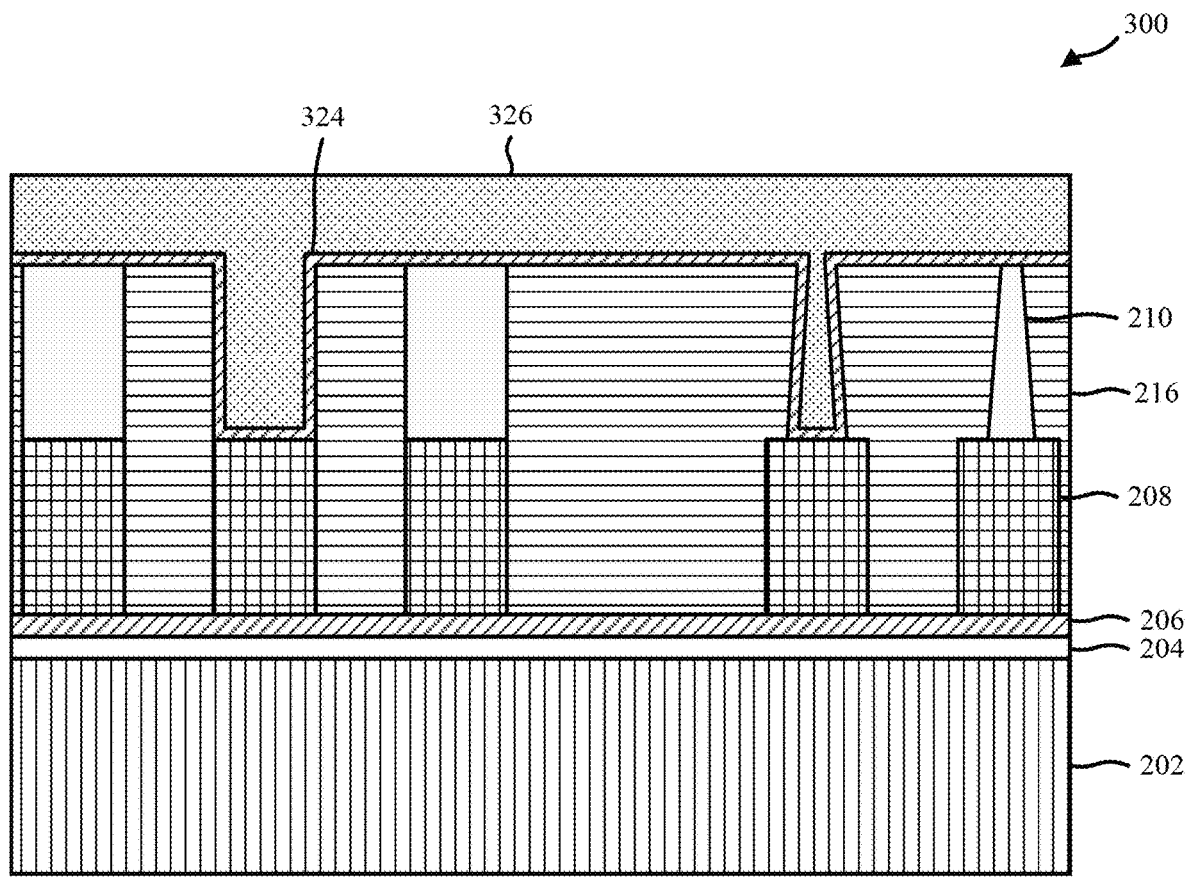
FIG. 3G is a schematic diagram illustrating the example semiconductor structure of FIG. 3F following the performance of additional fabrication operations, in accordance with embodiments of the present disclosure.

A metal fill 326 is then deposited into the vacancies 322. This is shown in FIG. 3G. In particular, deposition of the metal fill 326 may comprise first depositing a liner 324. The liner 324 may be, for example, an adhesive layer that allows the metal fill 326 to adhere to the semiconductor device 300. In some embodiments, the liner 324 may be TiN, and the metal fill 326 may be, for example, Cu, Al, Ru, or W.

Figure 3H:
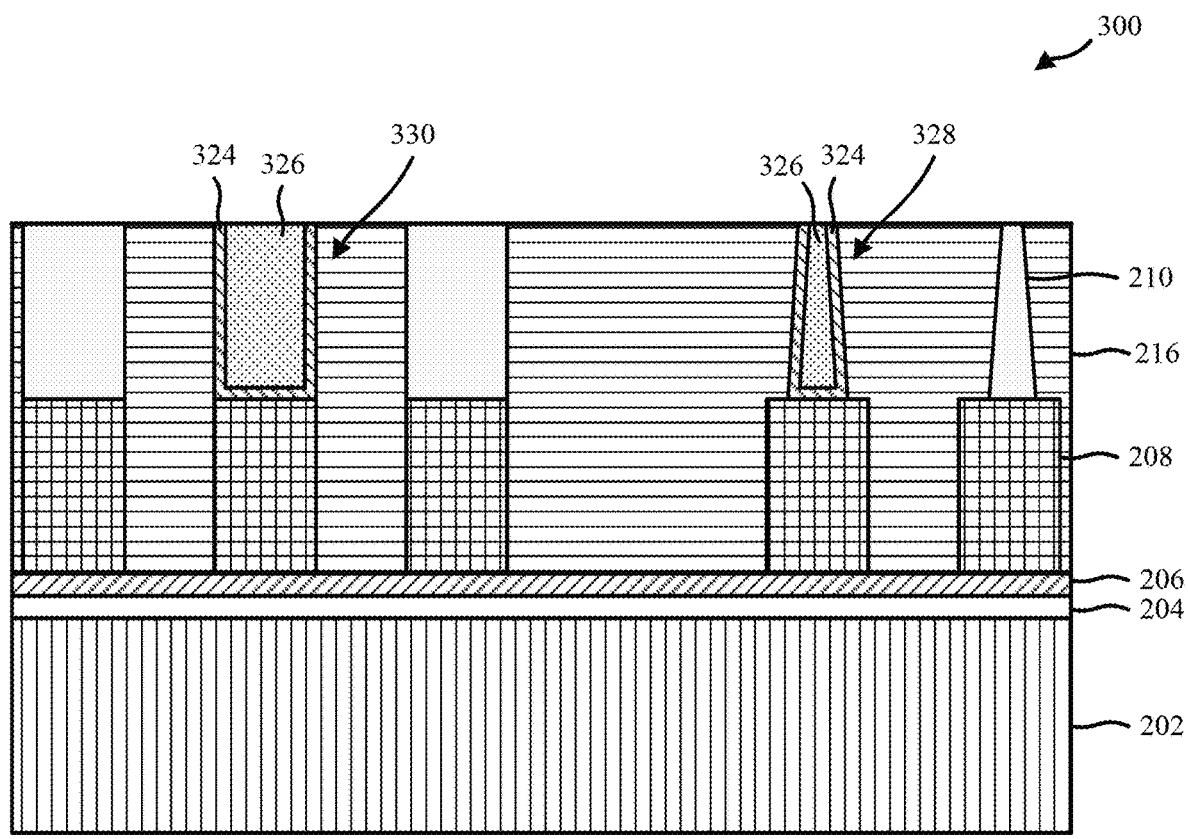
FIG. 3H is a schematic diagram illustrating the example semiconductor structure of FIG. 3G following the performance of additional fabrication operations, in accordance with embodiments of the present disclosure.

The metal fill 326 may be planarized using, for example, a CMP process. This is shown in FIG. 3H. In particular, the CMP process may remove the excess metal fill 326 that is not deposited in the vacancies 322. For example, as shown in FIG. 3H, the metal fill 326 may be planarized to a depth that removes all metal fill 326 and the liner 324 from the top of the dielectric layer 216 and the dummy vias 210, thereby electrically isolating the resulting top via 330 and the resulting eFuse 328.

Figure 3I:
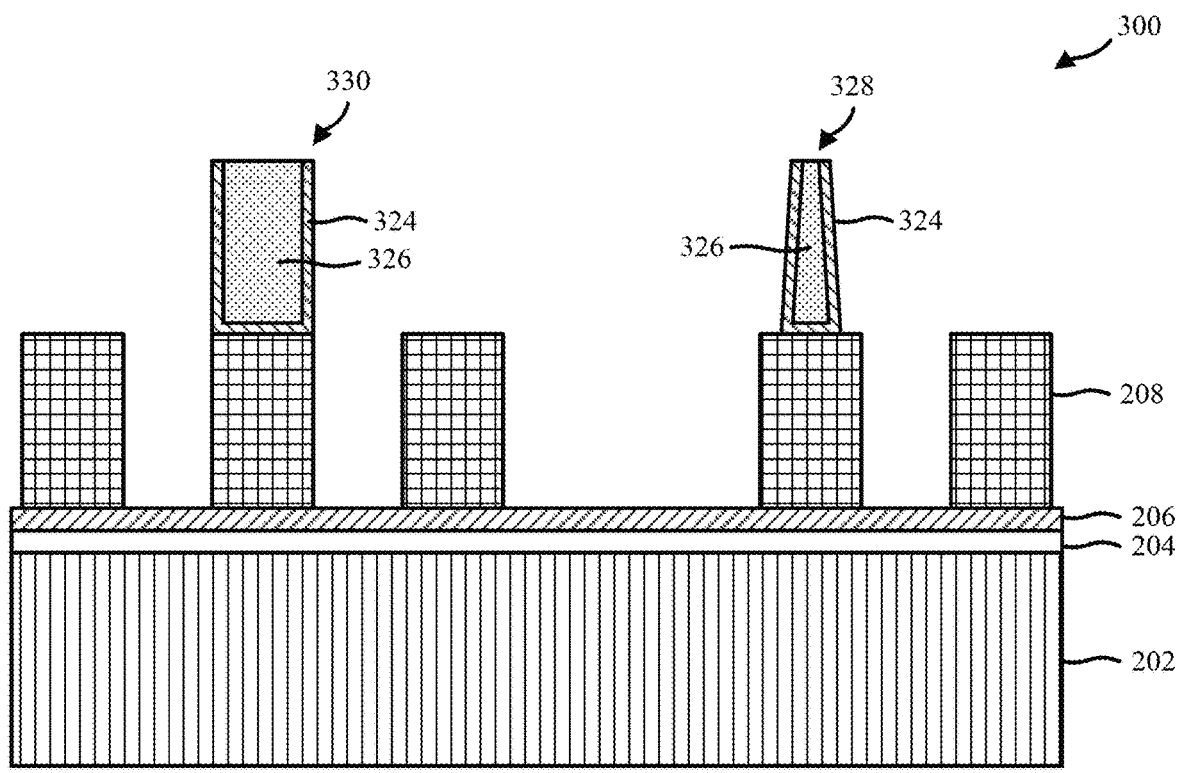
FIG. 3I is a schematic diagram illustrating the example semiconductor structure of FIG. 3H following the performance of additional fabrication operations, in accordance with embodiments of the present disclosure.

As shown in FIG. 3I, the dielectric layer 216 and the remaining dummy vias 210 may be removed. As previously discussed, removal of the dielectric layer 216 and the dummy vias 210 may be performed using, for example, an ASTR and dHF etch process.

Figure 3J:
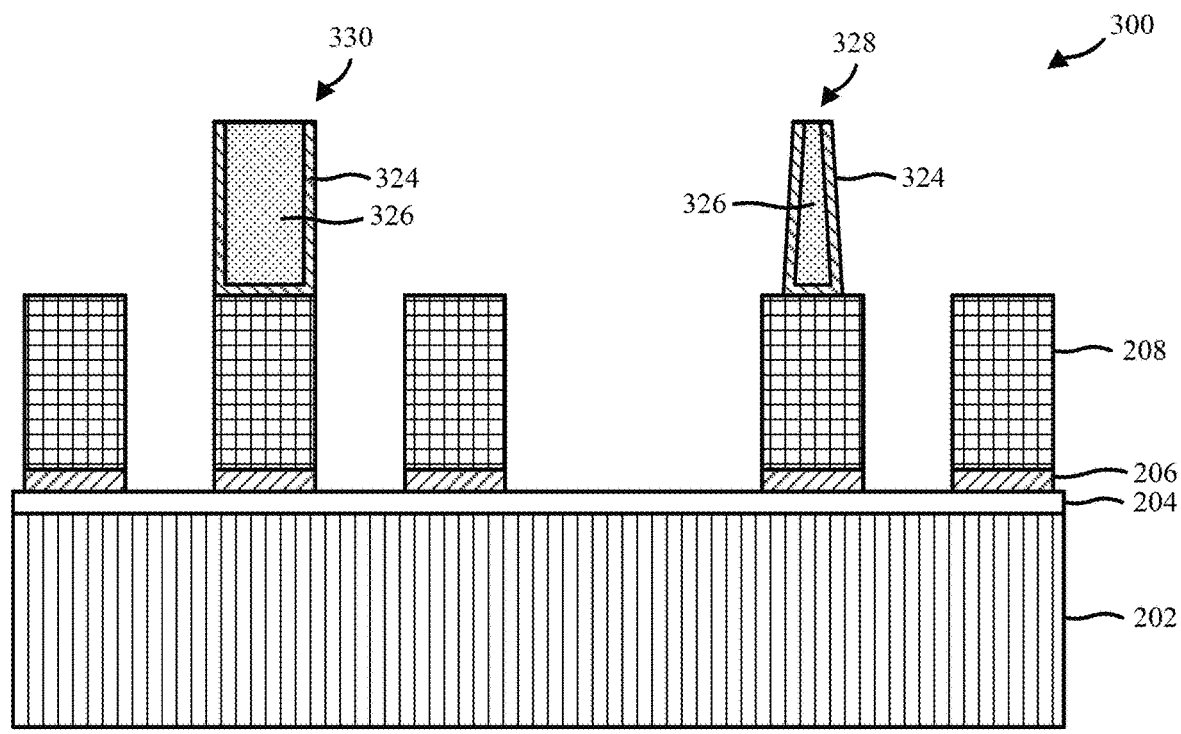
FIG. 3J is a schematic diagram illustrating the example semiconductor structure of FIG. 3I following the performance of additional fabrication operations, in accordance with embodiments of the present disclosure.

As shown in FIG. 3J, the barrier metal layer 206 may be selectively etched. In particular, an etching process may be performed to remove the barrier metal layer 206 from areas between the bottom lines 208. However, the barrier metal layer 206 may still exist underneath the bottom lines 208.

Figure 3K:
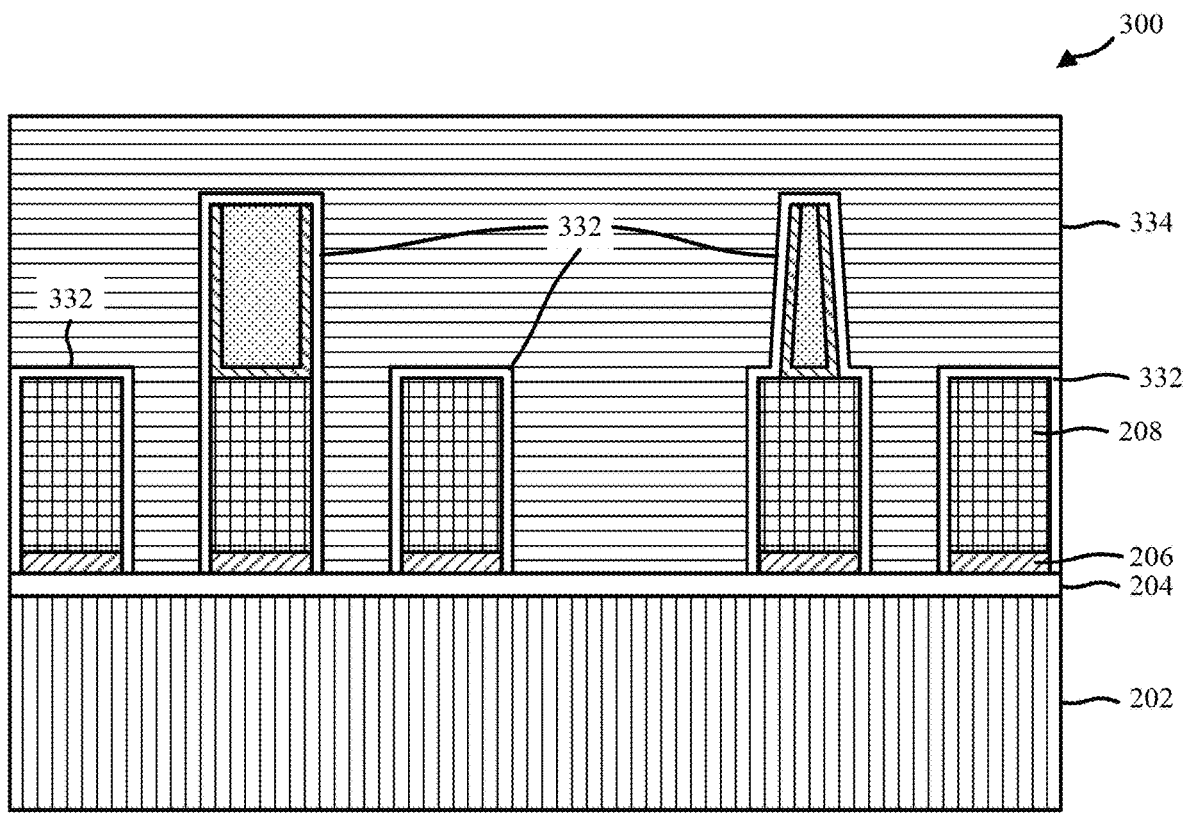
FIG. 3K is a schematic diagram illustrating the example semiconductor structure of FIG. 3J following the performance of additional fabrication operations, in accordance with embodiments of the present disclosure.

As shown in FIG. 3K, after removing the barrier metal layer 206 from between the lines 208, a layer of SiCN 332 is deposited on top of the bottom lines 208, the via 330, and the eFuse 328. A low-k dielectric 334 can then be deposited on top of the SiCN layer 332 using, for example, flowable chemical vapor deposition (fCVD). The low-k dielectric may be, for example, fluorine-doped silicon dioxide, organosilicate glass dielectrics (e.g., carbon-doped oxides), porous silicon dioxide, or any other suitable low-k dielectric material.

Figure 3L:
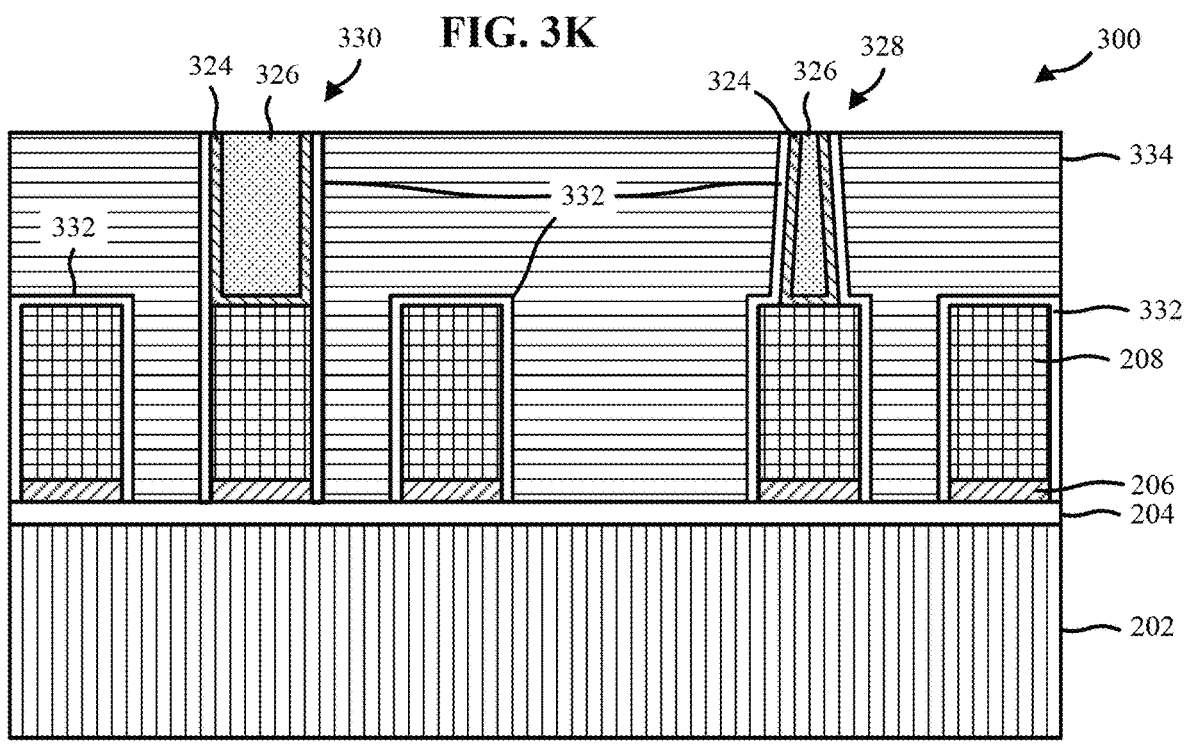
FIG. 3L is a schematic diagram illustrating the example semiconductor structure of FIG. 3K following the performance of additional fabrication operations, in accordance with embodiments of the present disclosure.

As shown in FIG. 3L, the semiconductor device 300 may be planarized to expose the metal fill 326 of both the via 330 and the eFuse 328. A cerium oxide based slurry may be used in the CMP process to remove the top of the low-k dielectric 334.

Figure 3M:
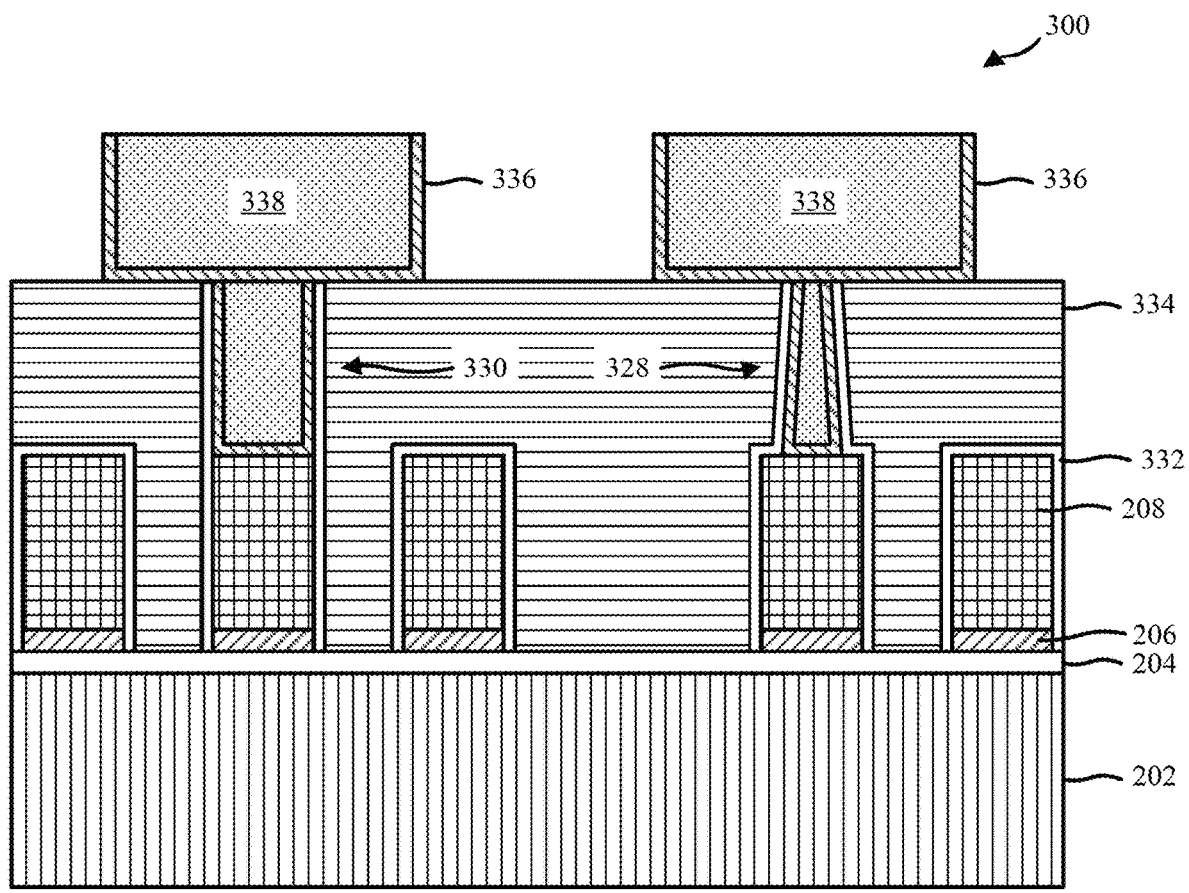
FIG. 3M is a schematic diagram illustrating the example semiconductor structure of FIG. 3L following the performance of additional fabrication operations, in accordance with embodiments of the present disclosure.

As shown in FIG. 3M, top lines can be formed on top of both the via 330 and the eFuse 328. The top lines may be formed using one or more known fabrication processes. The top lines may be made of a liner 336 and a metal fill 338. The liner may be, for example, TiN, and the metal fill 338 may be made out of any suitable conductive metal. For example, the metal fill 338 may be Cu, Al, Ru, W, etc. In some embodiments, the metal fill 338 may be made of the same material as the bottom lines 208 and/or the metal fill 326 of the via 330 and eFuse 328. However, in some embodiments, the metal fill 326, the metal fill 338, and the bottom lines 208 may be made of different conductive materials.

Reference will now be made to FIGS. 4A-4O, in which operations 104-108 are performed to form a semiconductor device 400 in accordance with a second embodiment of the present disclosure. Referring first to FIG. 4A, shown is the semiconductor device 400 (e.g., the semiconductor device 200 of FIG. 2C) after additional fabrication processing steps have been performed. In particular, FIG. 4A shows the semiconductor device 400 after one or more dummy vias 210 have been removed, thereby creating vacancies 418. The vacancies 418 may be in the locations where a via and an eFuse are going to be formed.

Figure 4B:
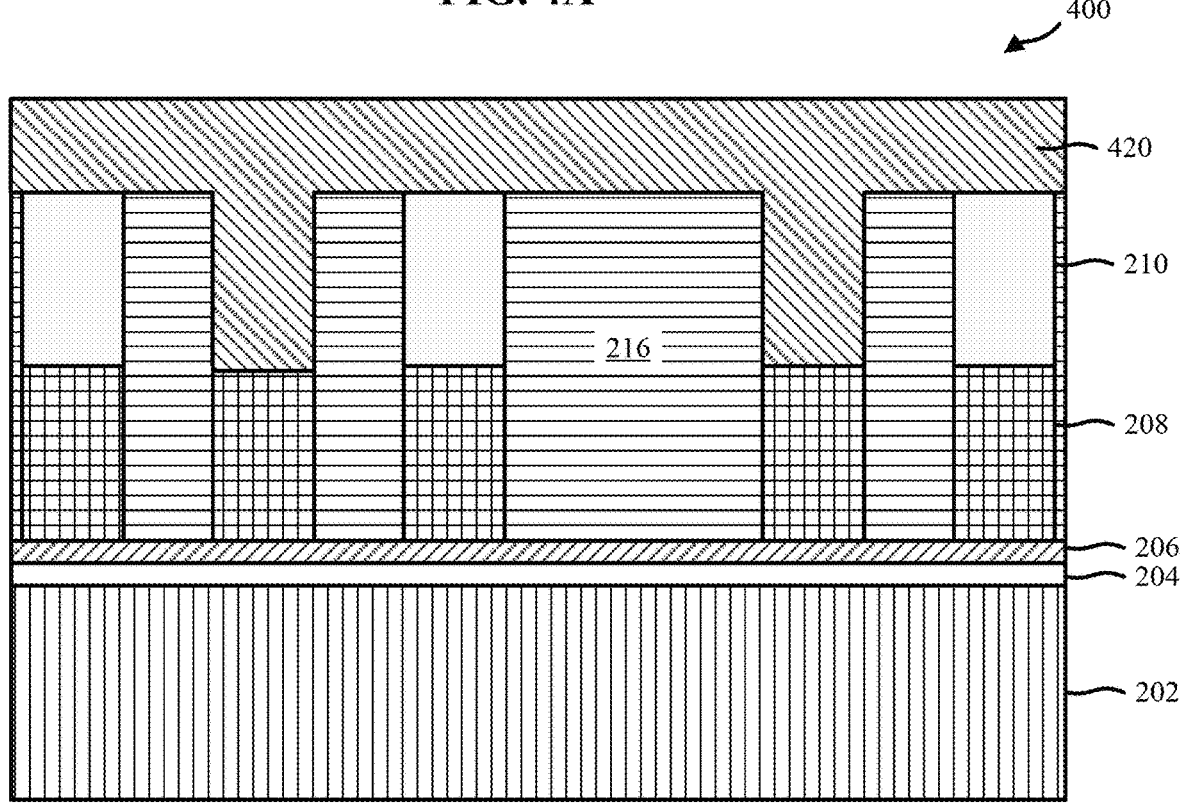
FIG. 4B is a schematic diagram illustrating the example semiconductor structure of FIG. 4A following the performance of additional fabrication operations, in accordance with embodiments of the present disclosure.

As shown in FIG. 4B, an OPL layer 420 is deposited on top of the semiconductor device 400. The OPL layer 420 may be deposited until it completely fills both vacancies 418. In addition, the OPL layer 420 may be formed on top of the other dummy vias 210 and the dielectric layer 216. This may be done to ensure that sufficient OPL has been deposited to completely fill both vacancies.

Figure 4C:
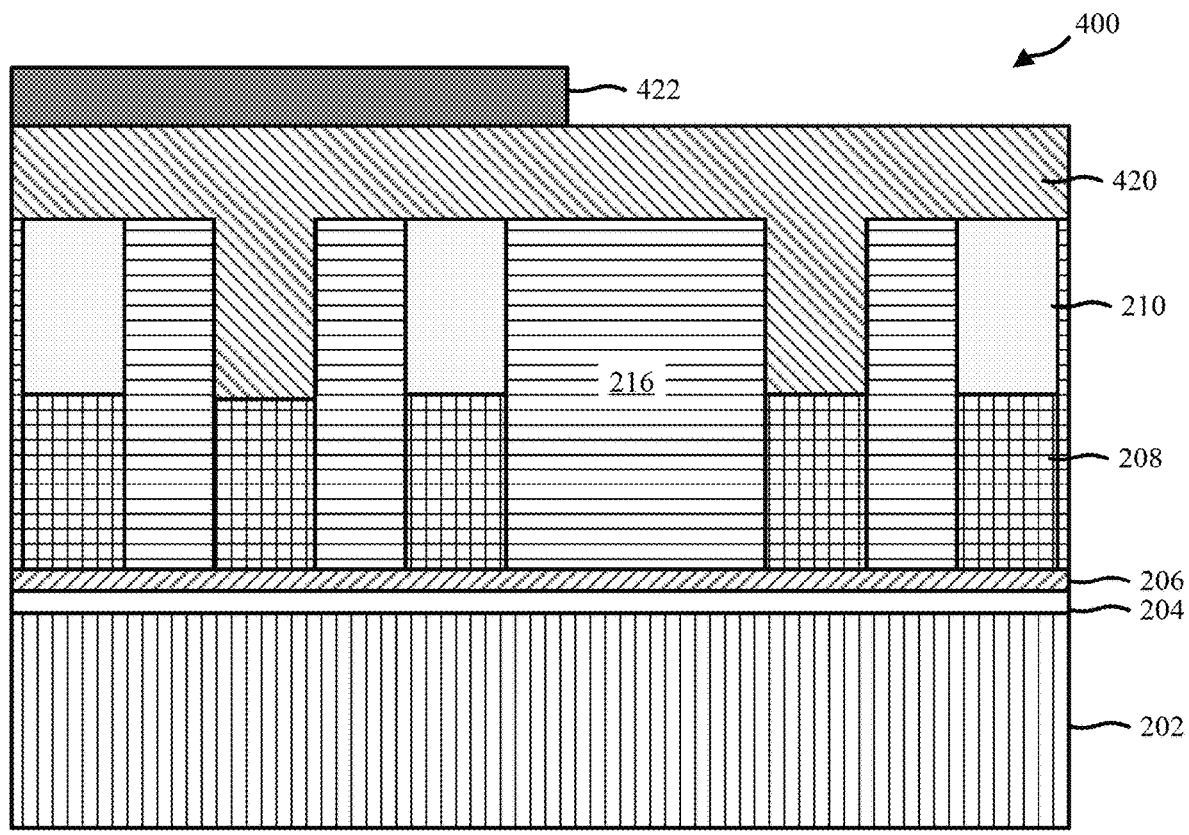
FIG. 4C is a schematic diagram illustrating the example semiconductor structure of FIG. 4B following the performance of additional fabrication operations, in accordance with embodiments of the present disclosure.

As shown in FIG. 4C, a hardmask 422 is deposited and patterned above a portion of the OPL layer 420. In particular, the hardmask 422 is deposited over the now-filled vacancy 418 that will subsequently be formed into a regular top via.

Figure 4D:
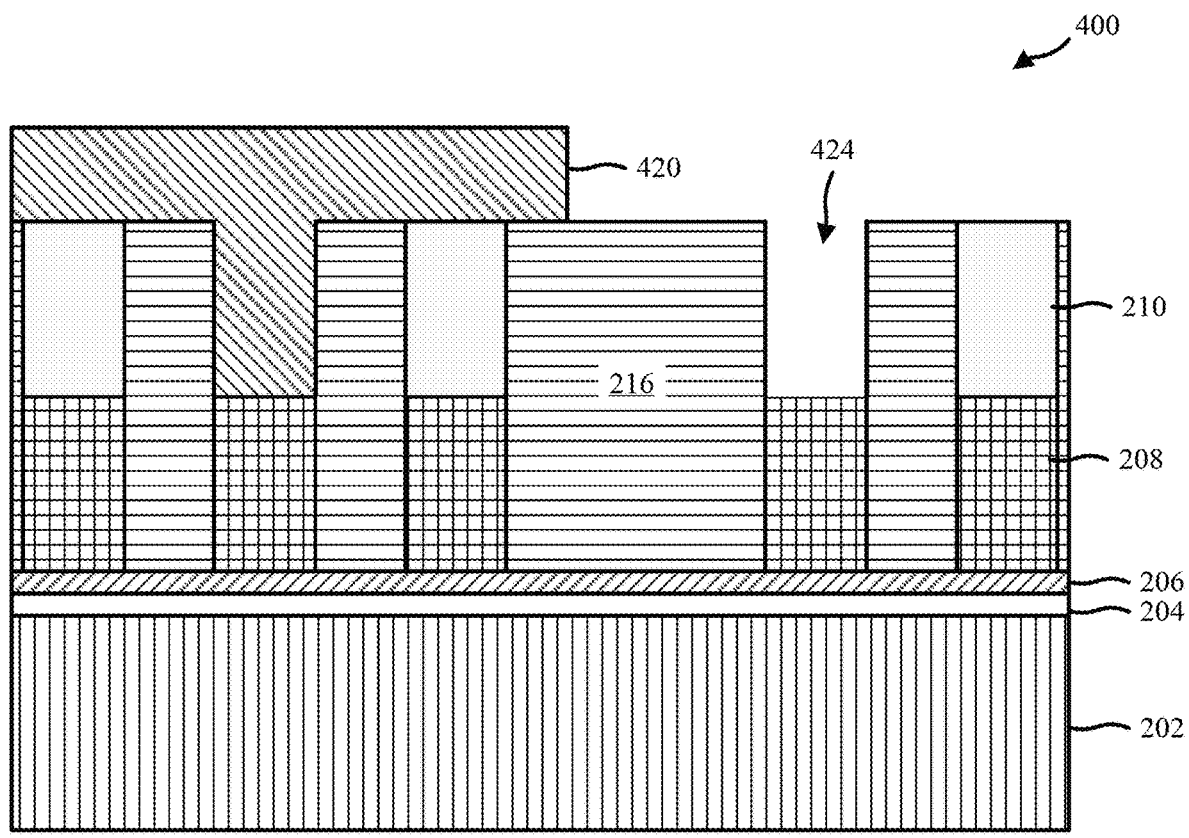
FIG. 4D is a schematic diagram illustrating the example semiconductor structure of FIG. 4C following the performance of additional fabrication operations, in accordance with embodiments of the present disclosure.

As shown in FIG. 4D, an OPL etch process is performed to remove the portion of the OPL layer 420 that was not under the hardmask 422. The OPL etch process may be selective to the dielectric material 216 and the metal line 208 such that only the exposed portion of the OPL layer 420 is removed. As a result of the OPL etch, an eFuse vacancy 424 is formed.

Figure 4E:
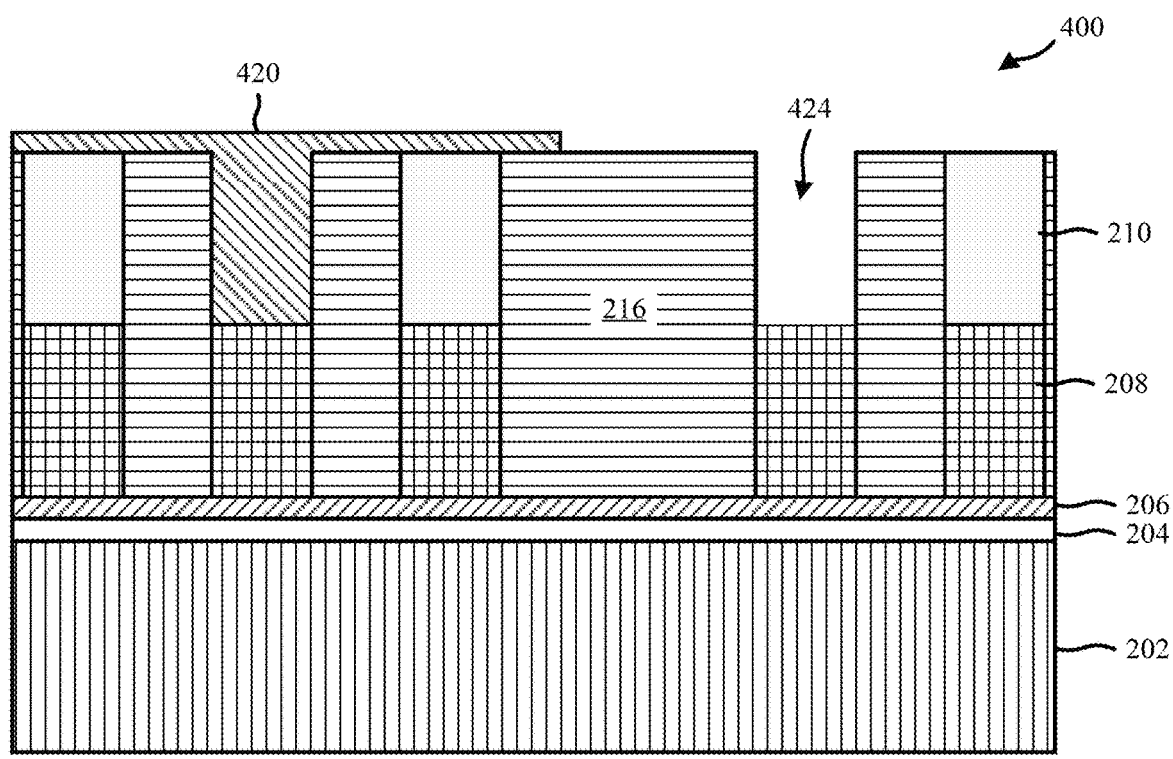
FIG. 4E is a schematic diagram illustrating the example semiconductor structure of FIG. 4D following the performance of additional fabrication operations, in accordance with embodiments of the present disclosure.

As shown in FIG. 4E, an OPL thinning process is performed. This reduces the thickness of the excess OPL layer 420 from the via vacancy.

Figure 4F:
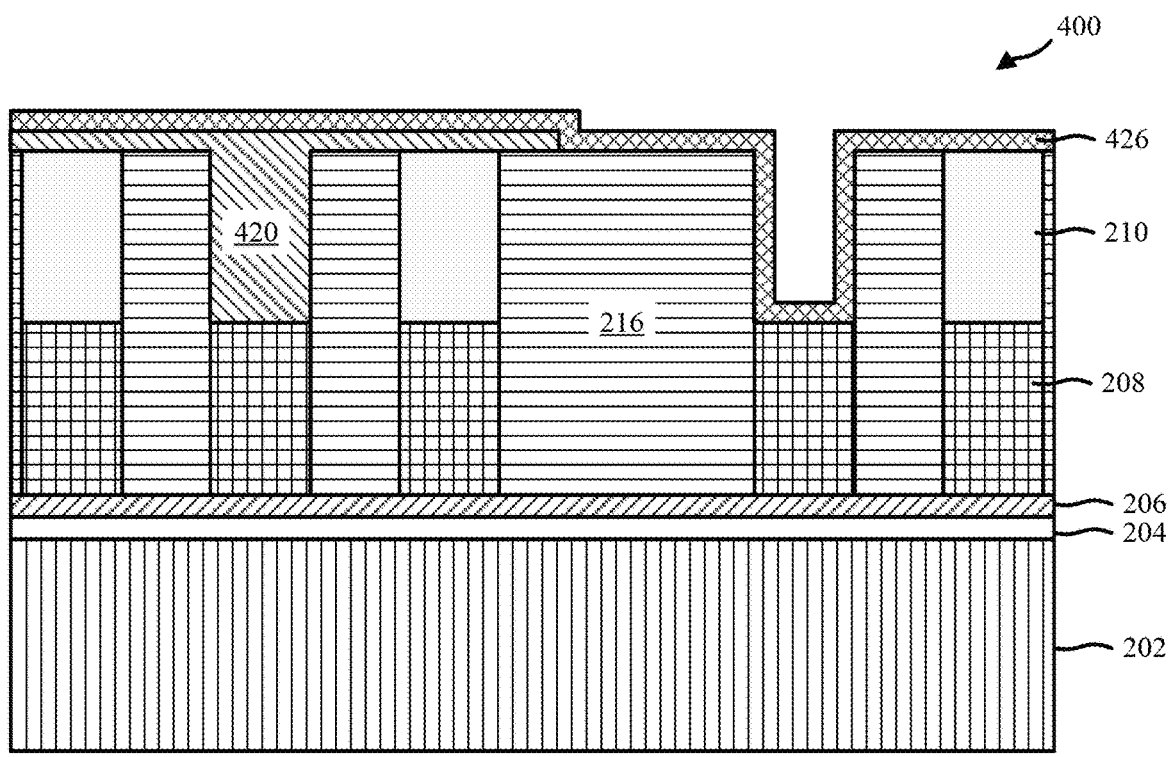
FIG. 4F is a schematic diagram illustrating the example semiconductor structure of FIG. 4E following the performance of additional fabrication operations, in accordance with embodiments of the present disclosure.

As shown in FIG. 4F, after thinning the OPL layer 420, a spacer layer 426 is deposited on top of the semiconductor device 400. The spacer layer 426 may be, for example, a layer of SiN or SiO2.

Figure 4G:
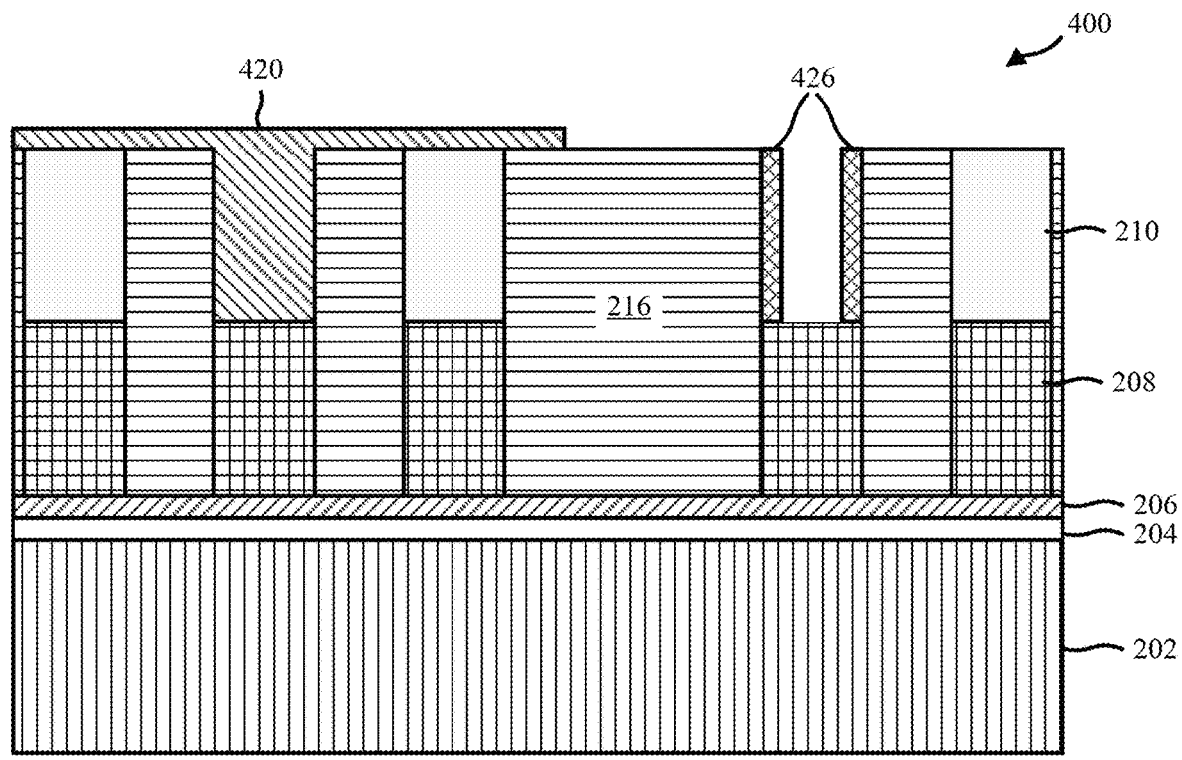
FIG. 4G is a schematic diagram illustrating the example semiconductor structure of FIG. 4F following the performance of additional fabrication operations, in accordance with embodiments of the present disclosure.

As shown in FIG. 4G, a spacer etchback process is performed to remove most of the spacer layer 426. In particular, the spacer layer 426 is removed from all of the semiconductor device 400 except that the spacer layer 426 still exists along the sidewalls of the via vacancy 424. However, the spacer layer 426 has been removed from the bottom of the via vacancy 424.

Figure 4H:
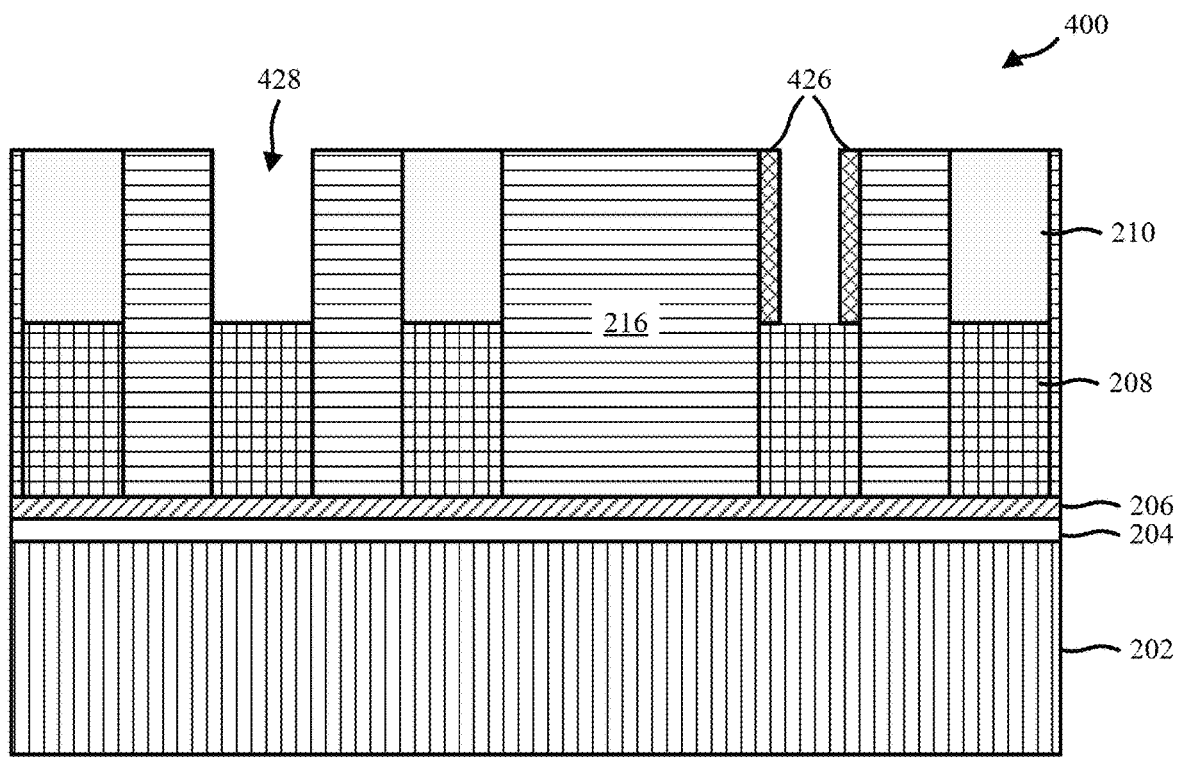
FIG. 4H is a schematic diagram illustrating the example semiconductor structure of FIG. 4G following the performance of additional fabrication operations, in accordance with embodiments of the present disclosure.

As shown in FIG. 4H, an OPL ash process is performed to remove the remaining part of the OPL layer 420 (shown in FIG. 4G). This creates a second vacancy 428, also referred to herein as a via vacancy 428, in the semiconductor device 400.

Figure 4I:
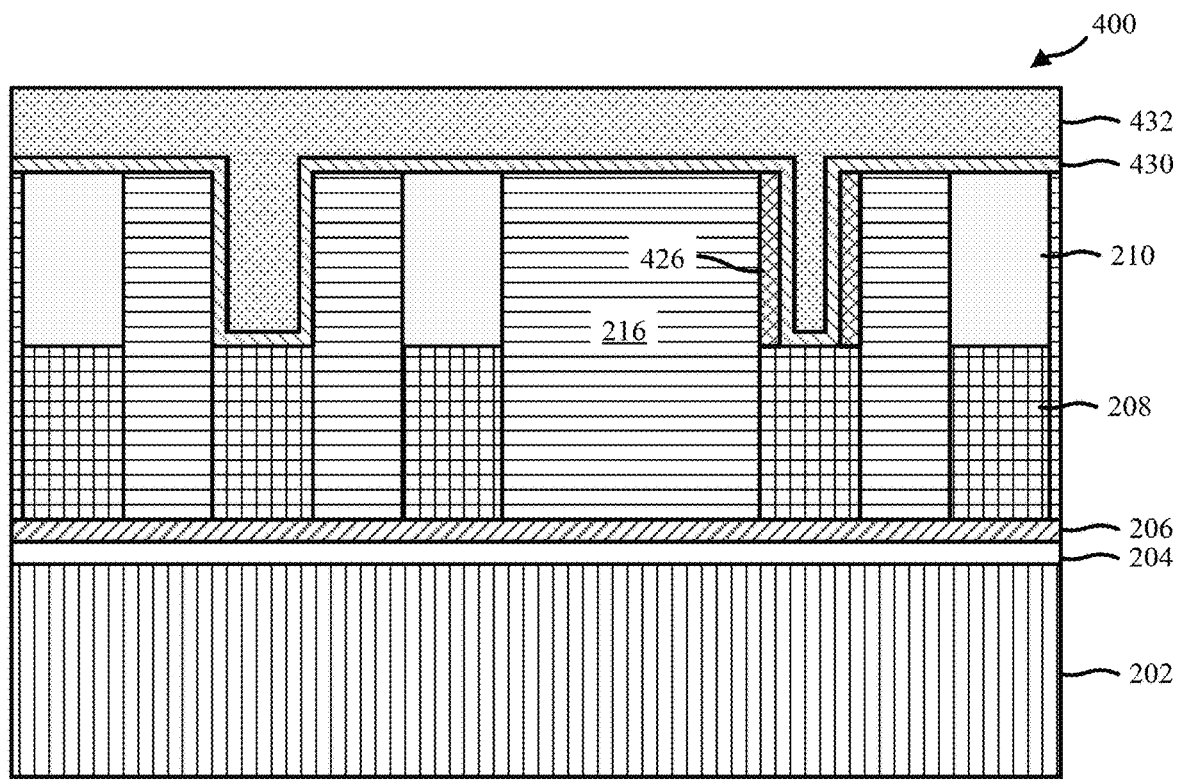
FIG. 4I is a schematic diagram illustrating the example semiconductor structure of FIG. 4H following the performance of additional fabrication operations, in accordance with embodiments of the present disclosure.

A metal fill 432 is then deposited into the vacancies 424, 428. This is shown in FIG. 4I. In particular, deposition of the metal fill 432 may comprise first depositing a liner 430 into the vacancies 424, 428. The liner 430 may be, for example, an adhesive layer that allows the metal fill 432 to adhere to the semiconductor device 400. In some embodiments, the liner 430 may be TiN, and the metal fill 432 may be, for example, Cu, Al, Ru, or W.

Figure 4J:
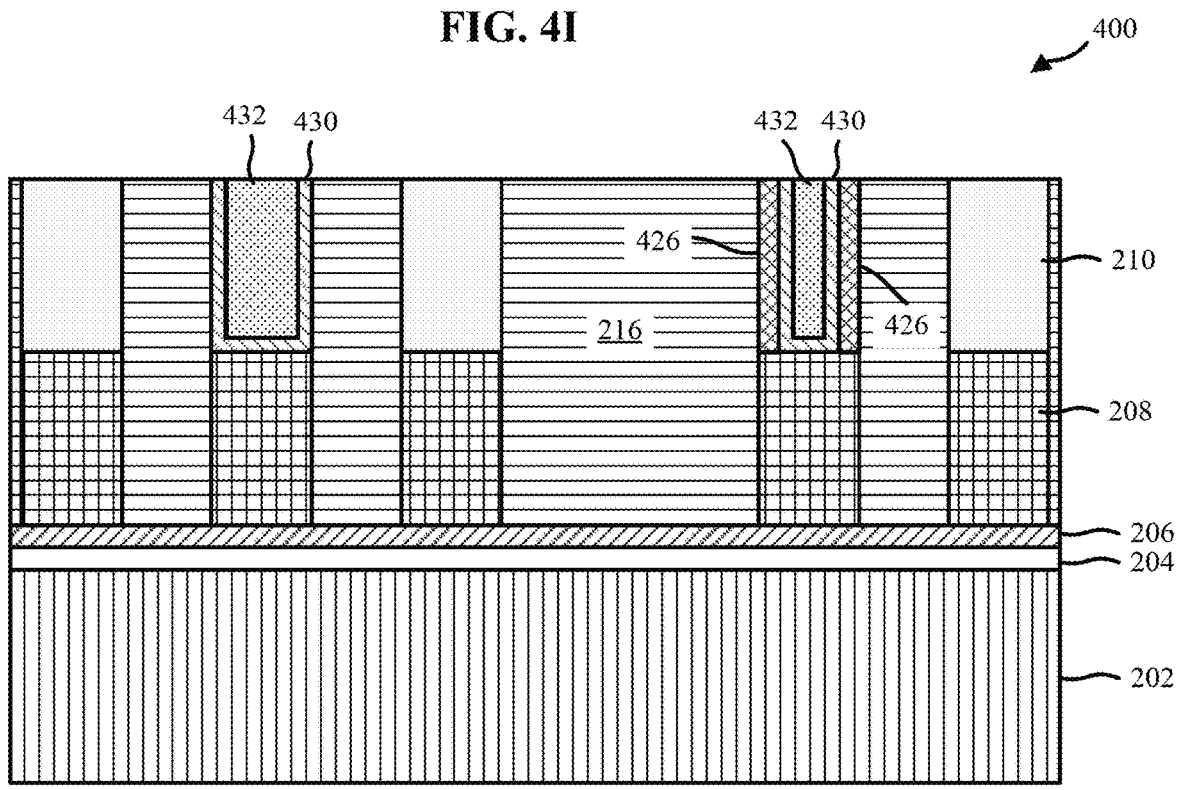
FIG. 4J is a schematic diagram illustrating the example semiconductor structure of FIG. 4I following the performance of additional fabrication operations, in accordance with embodiments of the present disclosure.

The metal fill 432 may be planarized using, for example, a CMP process. This is shown in FIG. 4J. In particular, the CMP process may remove the excess metal fill 432 that is not deposited in the vacancies 424, 428. For example, as shown in FIG. 4J, the metal fill 432 may be planarized to a depth that removes all metal fill 432 and the liner 430 from the top of the dielectric layer 216 and the dummy vias 210, thereby electrically isolating the resulting top via 436 and the resulting eFuse 434.

Figure 4K:
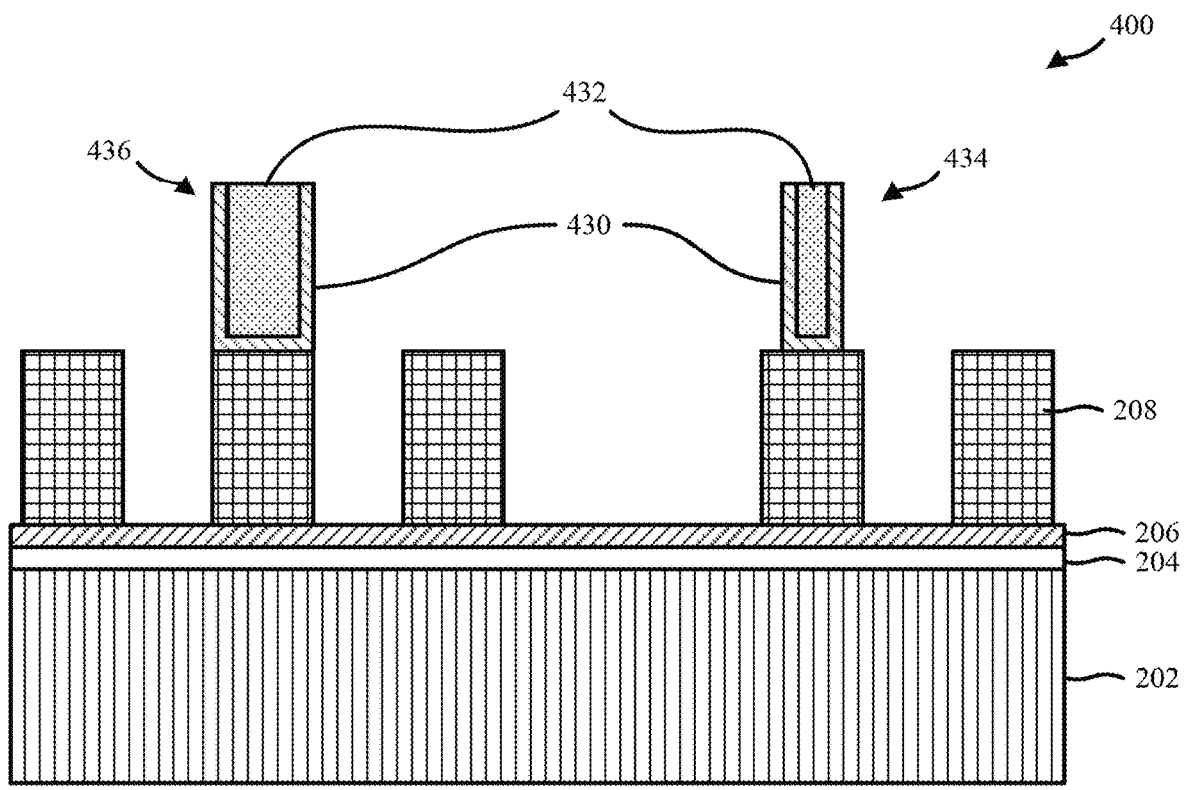
FIG. 4K is a schematic diagram illustrating the example semiconductor structure of FIG. 4J following the performance of additional fabrication operations, in accordance with embodiments of the present disclosure.

As shown in FIG. 4K, the dielectric layer 216 and the remaining dummy vias 210 may be removed. As previously discussed, removal of the dielectric layer 216 and the dummy vias 210 may be performed using, for example, an ASTR and dHF etch process.

Figure 4L:
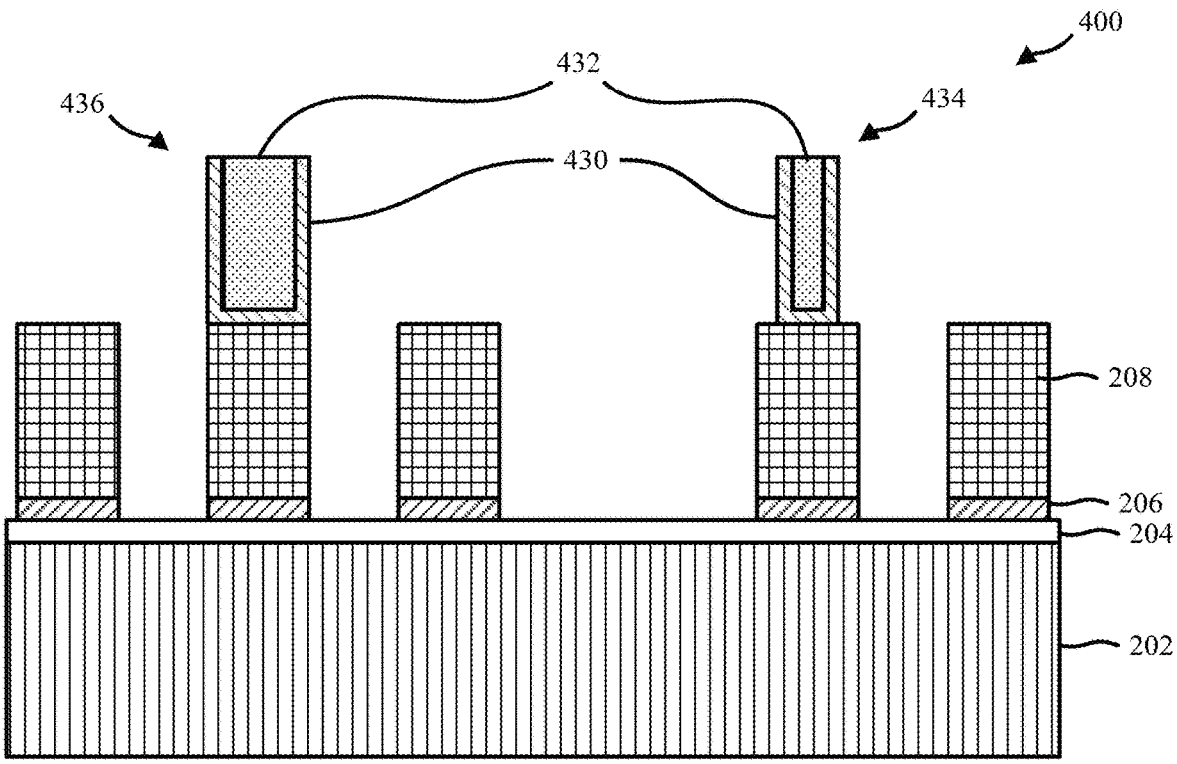
FIG. 4L is a schematic diagram illustrating the example semiconductor structure of FIG. 4K following the performance of additional fabrication operations, in accordance with embodiments of the present disclosure.

As shown in FIG. 4L, the barrier metal layer 206 may be selectively etched. In particular, an etching process may be performed to remove the barrier metal layer 206 from areas between the bottom lines 208. However, the barrier metal layer 206 may still exist underneath the bottom lines 208.

Figure 4M:
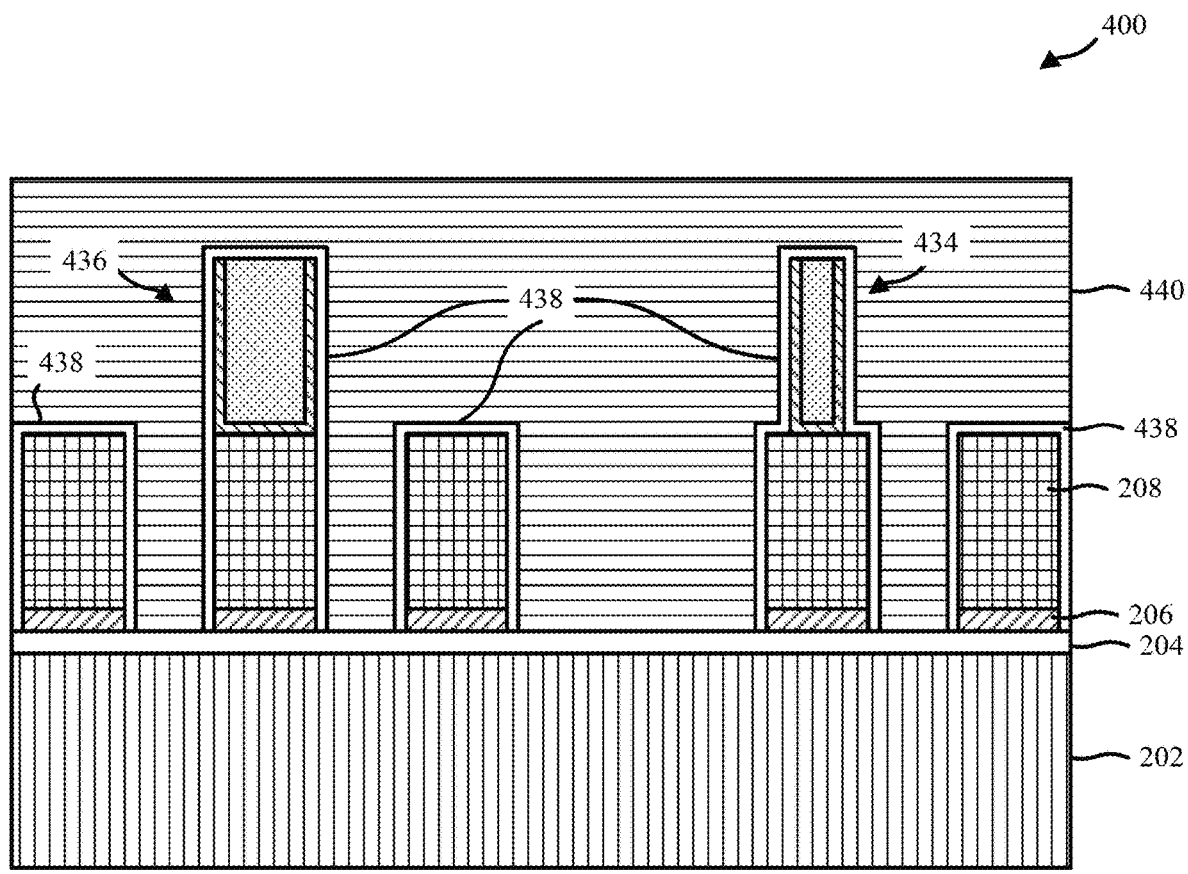
FIG. 4M is a schematic diagram illustrating the example semiconductor structure of FIG. 4L following the performance of additional fabrication operations, in accordance with embodiments of the present disclosure.

As shown in FIG. 4M, after removing the barrier metal layer 206 from between the lines 208, a layer of SiCN 438 is deposited on top of the bottom lines 208, the via 436, and the eFuse 434. A low-k dielectric 440 can then be deposited on top of the SiCN layer 438 using, for example, flowable chemical vapor deposition (fCVD). The low-k dielectric may be, for example, fluorine-doped silicon dioxide, organosilicate glass dielectrics (e.g., carbon-doped oxides), porous silicon dioxide, or any other suitable low-k dielectric material.

Figure 4N:
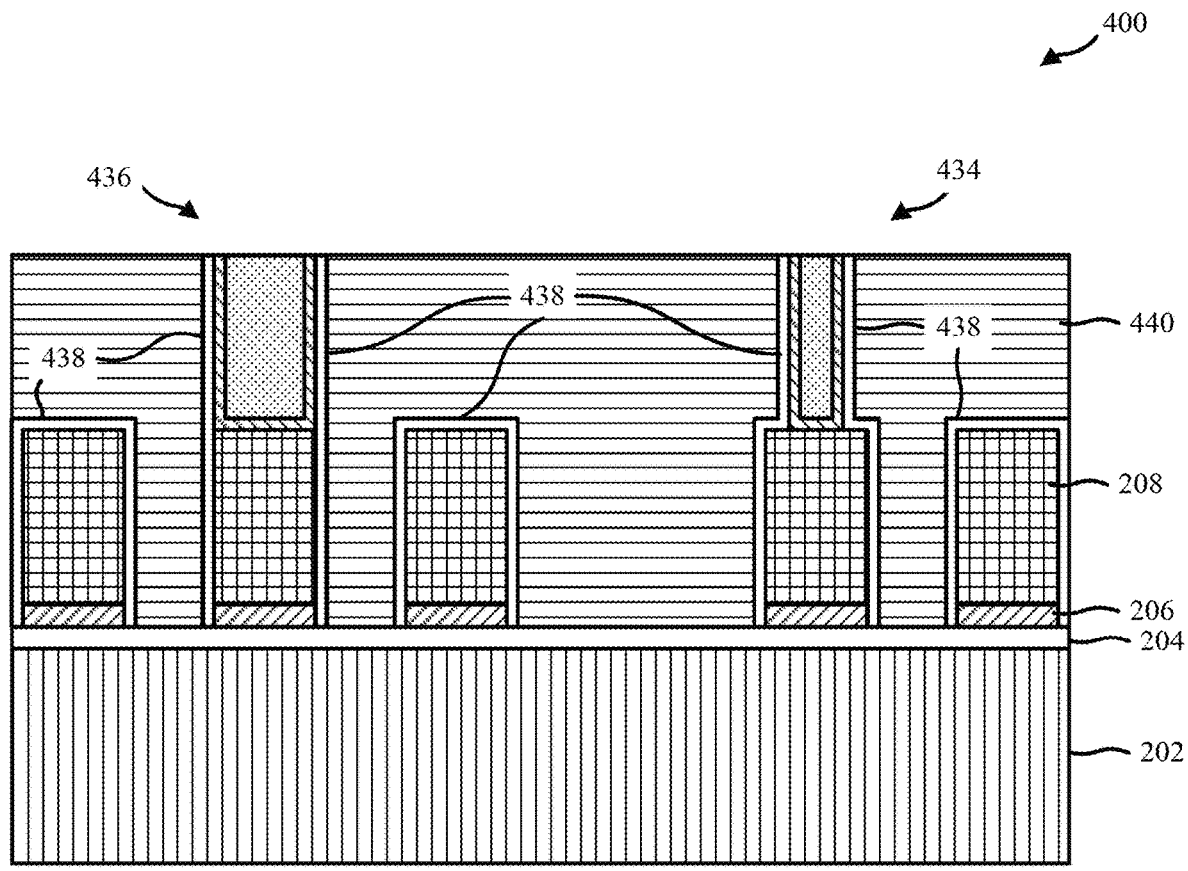
FIG. 4N is a schematic diagram illustrating the example semiconductor structure of FIG. 4M following the performance of additional fabrication operations, in accordance with embodiments of the present disclosure.
Figure 4O:
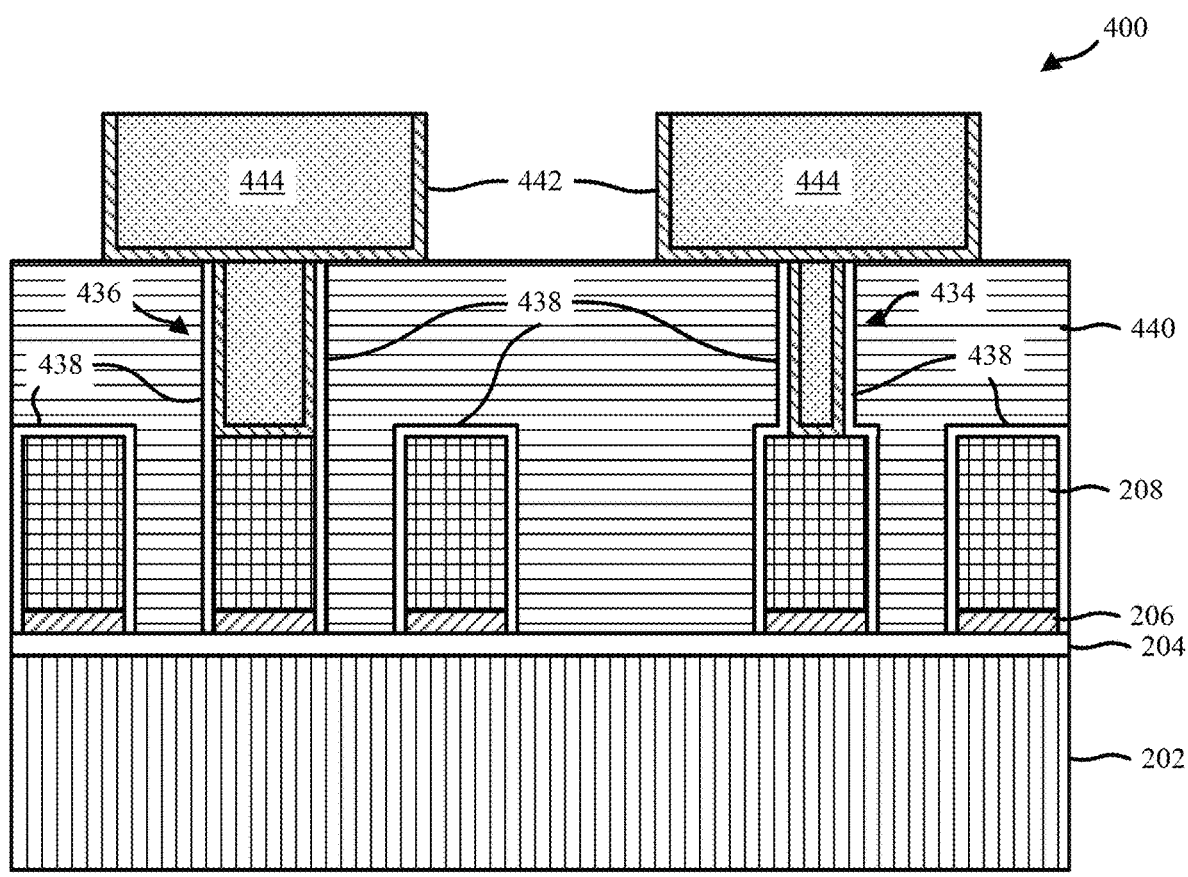
FIG. 4O is a schematic diagram illustrating the example semiconductor structure of FIG. 4N following the performance of additional fabrication operations, in accordance with embodiments of the present disclosure.

As shown in FIG. 4N, the semiconductor device 400 may be planarized to expose the metal fill 432 of both the via 436 and the eFuse 434. A cerium oxide based slurry may be used in the CMP process to remove the top of the low-k dielectric 440.

As shown in FIG. 4O, top lines can be formed on top of both the via 436 and the eFuse 434. The top lines may be formed using one or more known fabrication processes. The top lines may be made of a liner 442 and a metal fill 444. The liner 442 may be, for example, TiN, and the metal fill 444 may be made out of any suitable conductive metal. For example, the metal fill 444 may be Cu, Al, Ru, W, etc. In some embodiments, the metal fill 444 may be made of the same material as the bottom lines 208 and/or the metal fill 432 of the via 436 and eFuse 434. However, in some embodiments, the metal fill 444, the metal fill 432, and the bottom lines 208 may be made of different conductive materials.

It is to be understood that the aforementioned advantages are example advantages and should not be construed as limiting. Embodiments of the present disclosure can contain all, some, or none of the aforementioned advantages while remaining within the spirit and scope of the present disclosure.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description.

It should also be understood that material compounds will be described in terms of listed elements, e.g., SiN, SiCN, SiCO, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown because a person of ordinary skill in the art would recognize where masking and patterning processes are utilized to form the identified layers and openings, and to perform the identified selective etching processes, as described herein.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
    a plurality of bottom lines;
    one or more top vias arranged on top of the plurality of bottom lines;
    one or more electronic fuses (eFuses) arranged on top of the plurality of bottom lines, wherein each of the one or more eFuses is a via having a critical dimension smaller than the one or more top vias, and wherein a low-k dielectric material separates and electrically isolates the one or more vias and the one or more eFuses; and
    a plurality of top lines arranged on top of the one or more top vias and the one or more eFuses.

2. The semiconductor device of claim 1, wherein each of the one or more eFuses comprises a conductive metal fill surrounded by a liner material.

3. The semiconductor device of claim 2, wherein the conductive metal fill is Cu and the liner material is TiN.

4. The semiconductor device of claim 2, wherein each of the one or more eFuses further comprises a diffusion barrier in direct contact with the liner material, wherein the diffusion barrier surrounds the conductive metal fill and the liner material.

5. The semiconductor device of claim 1, wherein each of the one or more eFuses has a first thickness at a first end of the eFuse and a second thickness at a second end of the eFuse, wherein the second thickness is smaller than the first thickness.

6. The semiconductor device of claim 5, wherein the first end of each eFuse is in direct contact with a bottom line of the plurality of bottom lines, and the second end of each eFuse is in direct contact with a top line of the plurality of top lines.

7. The semiconductor device of claim 6, wherein the eFuse tapers from the first end to the second end.

8. The semiconductor device of claim 1, wherein the conductive metal fill is selected from the group consisting of W, Cu, Al, Ta, Co, Ru, and Rh.

9. A semiconductor device comprising:
    a plurality of bottom lines;
    one or more top vias arranged on top of the plurality of bottom lines;
    one or more electronic fuses (eFuses) arranged on top of the plurality of bottom lines, wherein each of the one or more eFuses is a via having a critical dimension smaller than the one or more top vias; and
    a plurality of top lines arranged on top of the one or more top vias and the one or more eFuses, wherein the first end of each eFuse is in direct contact with a bottom line of the plurality of bottom lines and the second end of each eFuse is in direct contact with a top line of the plurality of top lines.

10. The semiconductor device of claim 9, wherein each of the one or more eFuses comprises a conductive metal fill surrounded by a liner material.

11. The semiconductor device of claim 10, wherein the conductive metal fill is Cu and the liner material is TiN.

12. The semiconductor device of claim 10, wherein each of the one or more eFuses further comprises a diffusion barrier in direct contact with the liner material, wherein the diffusion barrier surrounds the conductive metal fill and the liner material.

13. The semiconductor device of claim 9, wherein the eFuse tapers from the first end to the second end.

14. The semiconductor device of claim 9, wherein each of the one or more eFuses has a first thickness at a first end of the eFuse and a second thickness that is smaller than the first thickness at a second end of the eFuse.

15. The semiconductor device of claim 9, wherein the conductive metal fill is selected from the group consisting of W, Cu, Al, Ta, Co, Ru, and Rh.

* * * * *